(12) United States Patent
Bielick et al.

(10) Patent No.: US 12,256,494 B2
(45) Date of Patent: Mar. 18, 2025

(54) MODIFIED INTERNAL CLEARANCE(S) AT CONNECTOR PIN APERTURE(S) OF A CIRCUIT BOARD

(71) Applicant: INTERNATIONAL BUSINESS MACHINES CORPORATION, Armonk, NY (US)

(72) Inventors: James D. Bielick, Pine Island, MN (US); Theron Lee Lewis, Rochester, MN (US); David J. Braun, St. Charles, MN (US); John R. Dangler, Rochester, MN (US); Timothy P. Younger, Rochester, MN (US); Stephen Michael Hugo, Stewartville, MN (US); Timothy Jennings, Rochester, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 224 days.

(21) Appl. No.: 18/048,456

(22) Filed: Oct. 21, 2022

(65) Prior Publication Data
US 2024/0138064 A1 Apr. 25, 2024
US 2024/0237210 A9 Jul. 11, 2024

(51) Int. Cl.
*H05K 1/11* (2006.01)
*H05K 3/00* (2006.01)
(Continued)

(52) U.S. Cl.
CPC .......... *H05K 1/116* (2013.01); *H05K 3/0005* (2013.01); *H05K 3/306* (2013.01); *H05K 1/184* (2013.01)

(58) Field of Classification Search
CPC ...... H05K 1/184; H05K 3/0005; H05K 3/306; H05K 1/116
See application file for complete search history.

(56) References Cited

U.S. PATENT DOCUMENTS 5,784,262 A 7/1998 Sherman
6,541,712 B1 4/2003 Gately et al.
(Continued)

FOREIGN PATENT DOCUMENTS

GB 2404092 A * 1/2005 ........... H05K 1/0251
WO WO-2013029041 A2 * 2/2013 ........... H05K 1/0251

OTHER PUBLICATIONS

IPC, "IPC-A-600K: Acceptability of Printed Boards", published Jul. 2020 at: https://www.ipc.org/TOC/IPC-A-600K-toc.pdf (5 pages) (Year: 2020).

(Continued)

*Primary Examiner* — Jeremy C Norris
(74) *Attorney, Agent, or Firm* — Michael A. Petrocelli, Esq.; Kevin P. Radigan, Esq.; Heslin Rothenberg Farley & Mesiti P.C.

(57) ABSTRACT

A method of fabricating a multilayer circuit board is provided which includes forming a layer of a the multilayer circuit board with an internal clearance region having a modified voltage-to-ground clearance of conductive material adjacent to an aperture of the multilayer circuit board. The modified voltage-to-ground clearance of conductive material is based on a configuration of a connector pin to be press-fit connected within the aperture of the multilayer circuit board, and the internal clearance region is enlarged in a direction of greatest normal force outward from the aperture with insertion of the connector pin into the aperture.

25 Claims, 14 Drawing Sheets

(51) Int. Cl.
*H05K 3/30* (2006.01)
*H05K 1/18* (2006.01)

(56) References Cited

U.S. PATENT DOCUMENTS

| | | |
|---|---|---|
| 6,747,862 B1 | 6/2004 | Skeoch |
| 7,645,944 B2 | 1/2010 | Casher et al. |
| 8,431,834 B2 | 4/2013 | Twardy et al. |
| 8,920,194 B2 | 12/2014 | Minich |
| 8,990,754 B2 | 3/2015 | Bird et al. |
| 9,202,783 B1 | 12/2015 | Simpson et al. |
| 9,544,922 B2 | 1/2017 | Minich |
| 9,545,003 B2 | 1/2017 | Rengarajan et al. |
| 9,730,313 B2 | 8/2017 | Gailus et al. |
| 2006/0185890 A1 | 8/2006 | Robinson |
| 2008/0101050 A1 | 5/2008 | Fung |
| 2008/0248658 A1 | 10/2008 | Cohen et al. |
| 2021/0022240 A1* | 1/2021 | Lin ............... H05K 1/0298 |

OTHER PUBLICATIONS

IPC, "IPC-A-610G: Acceptability of Electronic Assemblies", published Oct. 2017 at: https://www.ipc.org/TOC/IPC-A-610G.pdf (9 pages) (Year: 2017).
Taylor et al., "Generic Quality, Reliability and Performance Specification for IBM Systems & Technology Group Rigid Printed Circuit Boards", IBM Engineering Specification, PN 53P4082, Dec. 2008 (49 pages) (Year: 2008).
International Search Report & Written Opinion for PCT/EP2023/077440, dated Jan. 4, 2024 (10 pages) (Year: 2024).

* cited by examiner

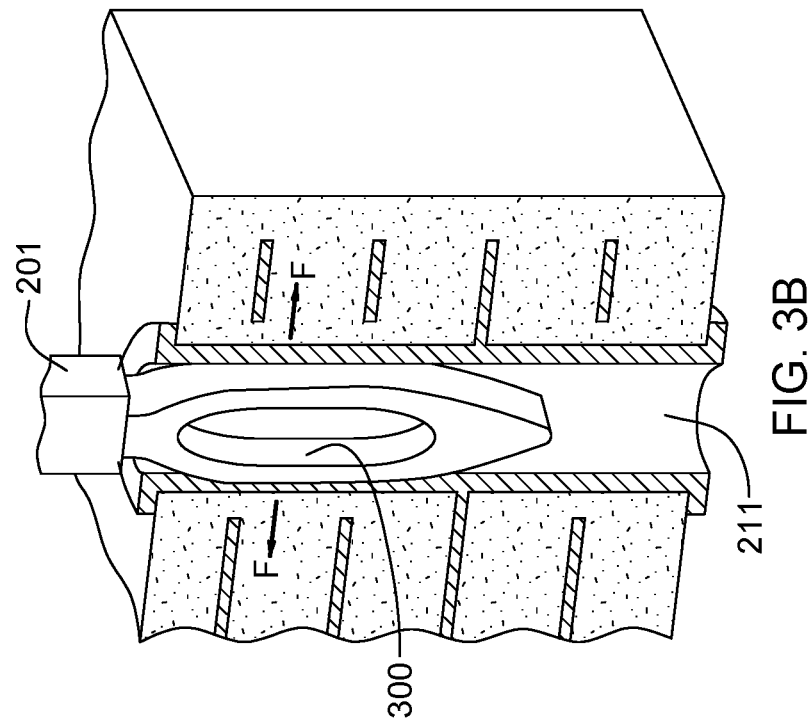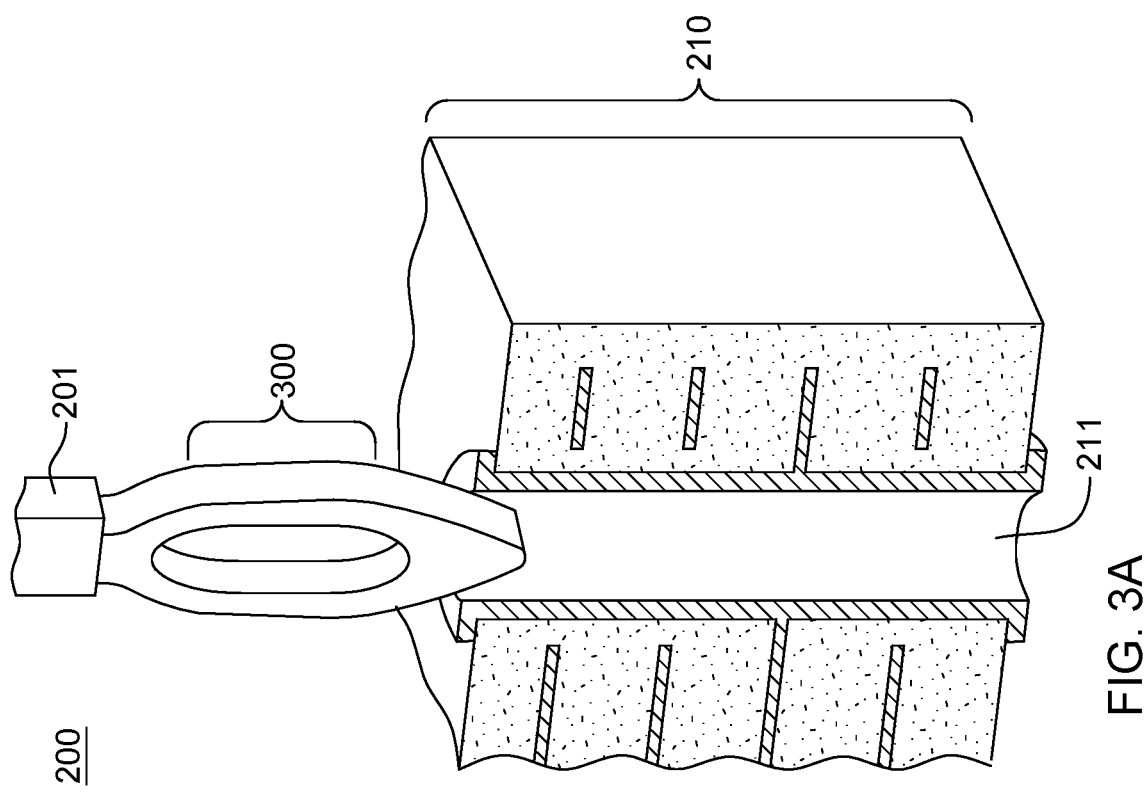

MODIFIED INTERNAL CLEARANCE(S) AT CONNECTOR PIN APERTURE(S) OF A CIRCUIT BOARD

BACKGROUND

One or more aspects relate, in general, to circuit board assemblies and fabrication thereof, and more particularly, to enhanced multilayer circuit board layouts, circuit board assemblies, and methods of fabricating circuit board assemblies.

A press-fit, interference-fit, or friction-fit, is a physical fastening between two parts achieved by friction after the parts are pushed together, rather than by applying a fastener or adhesive. Press-fit connectors are used in the electronics industry by circuit board manufacturers, where press-fit connections allow a manufacturer to avoid, for instance, soldering a connector to a circuit board. In this context, a press-fit connection is typically formed when a pin is inserted into, or fitted into, a platted through-hole in the circuit board. The use of press-fit connectors in circuit board assemblies is pervasive in the electronics industry.

Press-fit connectors can include solid pins or compliant pins. Most press-fit connections use compliant pin technology, since the pins require less force during the insertion process, which causes less damage to the circuit board plated through-holes, and produces more reliable connections. Press-fit connectors are used in a variety of applications including, for instance, in data and communication applications.

SUMMARY

Certain shortcomings of the prior art are overcome, and additional advantages are provided herein through the provision, in one aspect, of a method of fabricating a multilayer circuit board. The method includes forming a layer of the multilayer circuit board with an internal clearance region having a modified voltage-to-ground clearance of conductive material adjacent to an aperture of the multilayer circuit board. The modified voltage-to-ground clearance of conductive material is based on a configuration of a connector pin to be press-fit connected within the aperture of the multilayer circuit board. The internal clearance region is enlarged in a direction of greatest normal force outward from the aperture with insertion of the connector pin into the aperture. Advantageously, the modified voltage-to-ground clearance of conductive material adjacent to the aperture of the multilayer circuit board enhances critical clearances between conductors, such as power and ground conductors within the multilayer circuit board, and thereby enhances product reliability and integrity in a multilayer circuit board assembly using connector pins to, for instance, couple a component to the multilayer circuit board.

In one or more implementations, the internal clearance region includes an elongated clearance region about the aperture in the layer, with the longer axis of the elongated clearance region being oriented based, at least in part, on configuration of the connector pin to be received in the aperture to provide enhanced clearance between the conductive material in the direction of greatest normal force outward from the aperture with insertion of the connector pin into the aperture. Advantageously, the elongated clearance region around the aperture provides an enhanced clearance region or area in the layer to ensure there is sufficient dielectric material between conductive materials, such as between non-common power and ground conductors of the multilayer circuit board, notwithstanding possible deformation of the multilayer circuit board with insertion of the connector pin.

In one or more embodiments, forming the layer further includes orienting the longer axis of the elongated clearance region based on the configuration and an orientation of the connector pin to be received in the aperture to provide enhanced clearance between the conductive material in the direction of greatest normal force outward from the aperture with insertion of the connector pin into the aperture.

In one or more implementations, the aperture is a power-routing-related via of the multilayer circuit board, and the elongated clearance region defines an enhanced voltage-to-ground clearance between the power-routing-related via and a conductor in a respective layer of the multilayer circuit board. Product reliability and integrity are improved by defining the enhanced voltage-to-ground clearance between the power-routing-related via and the conductor in the respective layer of the multilayer circuit board.

In one or more implementations, the method further includes inserting the connector pin into the aperture of the multilayer circuit board to couple a component to the multilayer circuit board. The inserting produces deformation in the layer of the multilayer circuit board in the direction of greatest normal force outward from the aperture with insertion of the connector pin into the aperture, and the elongated clearance region provides the enhanced clearance between conductive material in the direction of greatest normal force outward from the aperture, providing a reduced risk of electrical shorting occurring based on the deformation caused by the connector pin insertion. By reducing the risk of an electrical short occurring based on deformation of one or more layers of the multilayer circuit board caused by the connector pin insertion, more reliable printed circuit board assemblies are provided.

In another aspect, a circuit board assembly is provided which includes a multilayer circuit board with one or more apertures. The one or more apertures are configured to receive one or more connector pins, and the multilayer circuit board is press-fit connectable via the one or more connector pins. The multilayer circuit board includes an internal clearance region in a layer of the multilayer circuit board, adjacent to an aperture of the one or more apertures, with a modified voltage-to-ground clearance of conductive material based on configuration of a respective connector pin of the one or more connector pins. By enhancing voltage-to-ground clearance of conductive material based on configuration of the respective connector pin, enhanced product reliability and integrity of the multilayer circuit board assembly are obtained using the connector pin to, for instance, couple the component to the multilayer circuit board.

In a further aspect, a computer-implemented method for producing a multilayer circuit board layout is provided which includes producing, using a circuit board design tool, a circuit board layout for a multilayer circuit board being fabricated. The producing includes identifying, by the circuit board design tool, a layer of the multilayer circuit board with an internal clearance region about an aperture of the multilayer circuit board having a voltage-to-ground clearance of conductive material to be modified, and determining, by the circuit board design tool, a configuration and orientation of a connector pin to be press-fit connected within the aperture of the multilayer circuit board. Further, the producing includes modifying, by the circuit board design tool, the voltage-to-ground clearance of conductive material in the internal clearance region of the layer about the aperture based on the determined configuration and orientation of the connector pin to be press-fit connected within the aperture of the multilayer circuit board, with the voltage-to-ground clearance being modified in a direction of greatest normal force outward from the aperture with insertion of the connector pin into the aperture. Advantageously, using a circuit board design tool in producing a circuit board layout with a modified voltage-to-ground clearance of conductive material in the internal clearance region of the layer about the aperture based on a determined configuration and orientation of the connector pin, enhances reliability and integrity of the resultant multilayer circuit board assembly where connector pins are used to, for instance, couple a component to the multilayer circuit board.

In another aspect, a computer system is provided which facilitates producing a multilayer circuit board layout. The computer system includes a memory and at least one processor in communication with the memory. The computer system is configured to perform a method, and the method includes producing, via a circuit board design tool, a circuit board layout for a multilayer circuit board being fabricated. The producing includes identifying, by the circuit board design tool, a layer of the multilayer circuit board with an internal clearance region about an aperture of the multilayer circuit board having a voltage-to-ground clearance of conductive material to be modified. The producing further includes determining, by the circuit board design tool, a configuration and orientation of a connector pin to be press-fit connected within the aperture of the multilayer circuit board. Further, the producing includes modifying, by the circuit board design tool, the voltage-to-ground clearance of conductive material in the internal clearance region of the layer about the aperture based on the determined configuration and orientation of the connector pin to be press-fit connected within the aperture of the multilayer circuit board. The voltage-to-ground clearance is modified in a direction of greatest normal force outward from the aperture with insertion of the connector pin into the aperture. Advantageously, modifying the voltage-to-ground clearance of conductive material in the internal clearance region of the layer about the aperture based on the determined configuration and orientation of the connector pin, enhances product reliability and integrity of the multilayer circuit board assembly.

In a further aspect, a computer program product is provided which facilitates producing a multilayer circuit board layout. The computer program product includes one or more computer-readable storage media and program instructions embodied therewith. The program instructions are readable by a processing circuit to cause the processing circuit to perform a method which includes producing, via a circuit board design tool, a circuit board layout for a multilayer circuit board being fabricated. The producing includes identifying, by the circuit board design tool, a layer of the multilayer circuit board with an internal clearance region about an aperture of the multilayer circuit board having a voltage-to-ground clearance of conductive material to be modified. Further, the producing includes determining, by the circuit board design tool, a configuration and orientation of a connector pin to be press-fit connected within the aperture of the multilayer circuit board. In addition, the producing includes modifying, by the circuit board design tool, the voltage-to-ground clearance of conductive material in the internal clearance region of the layer about the aperture based on the determined configuration and orientation of the connector pin to be press-fit connected within the aperture of the multilayer circuit board. The voltage-to-ground clearance is modified in a direction of greatest normal force outward from the aperture with insertion of the connector pin into the aperture, which advantageously enhances design of the produced circuit board layout, and thereby the resultant multilayer circuit board being fabricated. Advantageously, specifying, based on configuration of a connector pin to be received in the aperture, the enhanced clearance between conductive material and at least one internal region of the internal regions, enhances critical clearances between conductors, such as power and ground conductors within the multilayer circuit board, and thereby enhances product reliability and integrity in a multilayer circuit board assembly using connector pins to, for instance, couple a component to the multilayer circuit board.

Additional features and advantages are realized through the techniques described herein. Other embodiments and aspects are described in detail herein and are considered a part of the claimed aspects.

BRIEF DESCRIPTION OF THE DRAWINGS

One or more aspects are particularly pointed out and distinctly claimed as examples in the claims at the conclusion of the specification. The foregoing and objects, features, and advantages of one or more aspects are apparent from the following detailed description taken in conjunction with the accompanying drawings in which:

FIGS. 3A-3D illustrate insertion of a press-fit pin into an aperture of a multilayer circuit board, and possible deformation occurring within the multilayer circuit board due to insertion forces;

DETAILED DESCRIPTION

The accompanying figures, which are incorporated in and form a part of this specification, further illustrate the present invention and, together with this detailed description of the invention, serve to explain aspects of the present invention. Note in this regard that descriptions of well-known systems, devices, processing techniques, etc., are omitted so as to not unnecessarily obscure the invention in detail. It should be understood, however, that the detailed description and this specific example(s), while indicating aspects of the invention, are given by way of illustration only, and not limitation. Various substitutions, modifications, additions, and/or other arrangements, within the spirit or scope of the underlying inventive concepts will be apparent to those skilled in the art from this disclosure. Note further that numerous inventive aspects or features are disclosed herein, and unless inconsistent, each disclosed aspect or feature is combinable with any other disclosed aspect or feature as desired for a particular application of the concepts disclosed.

Note also that illustrative embodiments are described below using specific code, designs, architectures, protocols, layouts, schematics, or tools only as examples, and not by way of limitation. Furthermore, the illustrative embodiments are described in certain instances using particular software, tools, or data processing environments only as example for clarity of description. The illustrative embodiments can be used in conjunction with other comparable or similarly purposed structures, systems, applications, or architectures. One or more aspects of an illustrative embodiment can be implemented in software, hardware, or a combination thereof.

Figure 1:
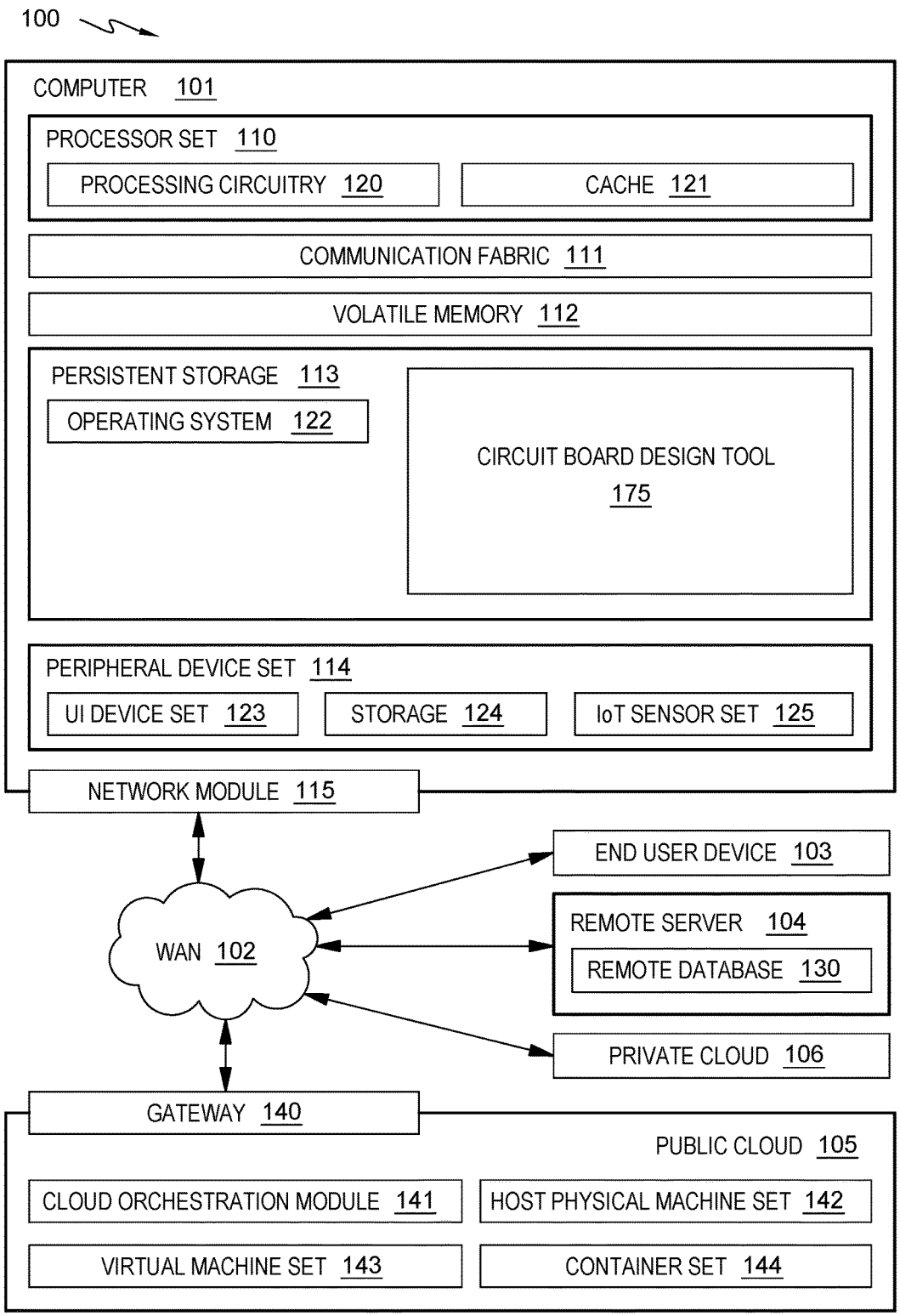
FIG. 1 depicts one example of a computing environment to include and/or use one or more aspects of the present invention.

As understood by one skilled in the art, program code, as referred to in this application, can include software and/or hardware. For example, program code in certain embodiments of the present invention can utilize a software-based implementation of the functions described, while other embodiments can include fixed function hardware. Certain embodiments combine both types of program code. Examples of program code, also referred to as one or more programs, are depicted in FIG. 1 as operating system 122 and circuit board design code 126, which are stored in persistent storage 113, as well as cloud orchestration module 141, virtual machine set 143, and container set 144, which are part of public cloud 105, in the example computing environment 100 of FIG. 1. In another example, program code depicted in the computing environment of FIG. 8 includes, in part, application program(s) 816, operating system 818, circuit board design code 820, and computer-readable program instruction(s) 822, which are stored in memory 806 of computer system 802.

Prior to describing embodiments of the present invention, an example of a computing environment to include and/or use one or more aspects of the present invention is discussed below with reference to FIG. 1.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Computing environment 100 contains an example of an environment for the execution of at least some of the computer code involved in performing the inventive methods, such as circuit board design tool or code block 175. In addition to block 126, computing environment 100 includes, for example, computer 101, wide area network (WAN) 102, end user device (EUD) 103, remote server 104, public cloud 105, and private cloud 106. In this embodiment, computer 101 includes processor set 110 (including processing circuitry 120 and cache 121), communication fabric 111, volatile memory 112, persistent storage 113 (including operating system 122 and block 175, as identified above), peripheral device set 114 (including user interface (UI) device set 123, storage 124, and Internet of Things (IoT) sensor set 125), and network module 115. Remote server 104 includes remote database 130. Public cloud 105 includes gateway 140, cloud orchestration module 141, host physical machine set 142, virtual machine set 143, and container set 144.

Computer 101 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 130. As is well understood in the art of computer technology, and depending upon the technology, performance of a computer-implemented method may be distributed among multiple computers and/or between multiple locations. On the other hand, in this presentation of computing environment 100, detailed discussion is focused on a single computer, specifically computer 101, to keep the presentation as simple as possible. Computer 101 may be located in a cloud, even though it is not shown in a cloud in FIG. 1. On the other hand, computer 101 is not required to be in a cloud except to any extent as may be affirmatively indicated.

Processor set 110 includes one, or more, computer processors of any type now known or to be developed in the future. Processing circuitry 120 may be distributed over multiple packages, for example, multiple, coordinated integrated circuit chips. Processing circuitry 120 may implement multiple processor threads and/or multiple processor cores. Cache 121 is memory that is located in the processor chip package(s) and is typically used for data or code that should be available for rapid access by the threads or cores running on processor set 110. Cache memories are typically organized into multiple levels depending upon relative proximity to the processing circuitry. Alternatively, some, or all, of the cache for the processor set may be located "off chip." In some computing environments, processor set 110 may be designed for working with qubits and performing quantum computing.

Computer readable program instructions are typically loaded onto computer 101 to cause a series of operational steps to be performed by processor set 110 of computer 101 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 121 and the other storage media discussed below. The program instructions, and associated data, are accessed by processor set 110 to control and direct performance of the inventive methods. In computing environment 100, at least some of the instructions for performing the inventive methods may be stored in block 175 in persistent storage 113.

Communication fabric 111 is the signal conduction paths that allow the various components of computer 101 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

Volatile memory 112 is any type of volatile memory now known or to be developed in the future. Examples include dynamic type random access memory (RAM) or static type RAM. Typically, the volatile memory is characterized by random access, but this is not required unless affirmatively indicated. In computer 101, the volatile memory 112 is located in a single package and is internal to computer 101, but, alternatively or additionally, the volatile memory may be distributed over multiple packages and/or located externally with respect to computer 101.

Persistent storage 113 is any form of non-volatile storage for computers that is now known or to be developed in the future. The non-volatility of this storage means that the stored data is maintained regardless of whether power is being supplied to computer 101 and/or directly to persistent storage 113. Persistent storage 113 may be a read only memory (ROM), but typically at least a portion of the persistent storage allows writing of data, deletion of data and re-writing of data. Some familiar forms of persistent storage include magnetic disks and solid state storage devices. Operating system 122 may take several forms, such as various known proprietary operating systems or open source Portable Operating System Interface type operating systems that employ a kernel. The tool or code included in block 175 typically includes at least some of the computer code involved in performing the inventive methods.

Peripheral device set 114 includes the set of peripheral devices of computer 101. Data communication connections between the peripheral devices and the other components of computer 101 may be implemented in various ways, such as Bluetooth connections, Near-Field Communication (NFC) connections, connections made by cables (such as universal serial bus (USB) type cables), insertion type connections (for example, secure digital (SD) card), connections made though local area communication networks and even connections made through wide area networks such as the internet. In various embodiments, UI device set 123 may include components such as a display screen, speaker, microphone, wearable devices (such as goggles and smart watches), keyboard, mouse, printer, touchpad, game controllers, and haptic devices. Storage 124 is external storage, such as an external hard drive, or insertable storage, such as an SD card. Storage 124 may be persistent and/or volatile. In some embodiments, storage 124 may take the form of a quantum computing storage device for storing data in the form of qubits. In embodiments where computer 101 is required to have a large amount of storage (for example, where computer 101 locally stores and manages a large database) then this storage may be provided by peripheral storage devices designed for storing very large amounts of data, such as a storage area network (SAN) that is shared by multiple, geographically distributed computers. IoT sensor set 125 is made up of sensors that can be used in Internet of Things applications. For example, one sensor may be a thermometer and another sensor may be a motion detector.

Network module 115 is the collection of computer software, hardware, and firmware that allows computer 101 to communicate with other computers through WAN 102. Network module 115 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 115 are performed on the same physical hardware device. In other embodiments (for example, embodiments that utilize software-defined networking (SDN)), the control functions and the forwarding functions of network module 115 are performed on physically separate devices, such that the control functions manage several different network hardware devices. Computer readable program instructions for performing the inventive methods can typically be downloaded to computer 101 from an external computer or external storage device through a network adapter card or network interface included in network module 115.

WAN 102 is any wide area network (for example, the internet) capable of communicating computer data over non-local distances by any technology for communicating computer data, now known or to be developed in the future. In some embodiments, the WAN may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

End User Device (EUD) 103 is any computer system that is used and controlled by an end user (for example, a customer of an enterprise that operates computer 101), and may take any of the forms discussed above in connection with computer 101. EUD 103 typically receives helpful and useful data from the operations of computer 101. For example, in a hypothetical case where computer 101 is designed to provide a recommendation to an end user, this recommendation would typically be communicated from network module 115 of computer 101 through WAN 102 to EUD 103. In this way, EUD 103 can display, or otherwise present, the recommendation to an end user. In some embodiments, EUD 103 may be a client device, such as thin client, heavy client, mainframe computer, desktop computer and so on.

Remote server 104 is any computer system that serves at least some data and/or functionality to computer 101. Remote server 104 may be controlled and used by the same entity that operates computer 101. Remote server 104 represents the machine(s) that collect and store helpful and useful data for use by other computers, such as computer 101. For example, in a hypothetical case where computer 101 is designed and programmed to provide a recommendation based on historical data, then this historical data may be provided to computer 101 from remote database 130 of remote server 104.

Public cloud 105 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 105 is performed by the computer hardware and/or software of cloud orchestration module 141. The computing resources provided by public cloud 105 are typically implemented by virtual computing environments that run on various computers making up the computers of host physical machine set 142, which is the universe of physical computers in and/or available to public cloud 105. The virtual computing environments (VCEs) typically take the form of virtual machines from virtual machine set 143 and/or containers from container set 144. It is understood that these VCEs may be stored as images and may be transferred among and between the various physical machine hosts, either as images or after instantiation of the VCE. Cloud orchestration module 141 manages the transfer and storage of images, deploys new instantiations of VCEs and manages active instantiations of VCE deployments. Gateway 140 is the collection of computer software, hardware, and firmware that allows public cloud 105 to communicate through WAN 102.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

Private cloud 106 is similar to public cloud 105, except that the computing resources are only available for use by a single enterprise. While private cloud 106 is depicted as being in communication with WAN 102, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 105 and private cloud 106 are both part of a larger hybrid cloud.

Circuit boards, or printed circuit boards, mechanically support and electrically connect components, such as electronic components and/or electrical components, using conductive lines, paths, and other features, etched from one or more sheet layers of, for instance, copper laminated onto and/or between sheet layers of a non-conductive material or substrate, such as a glass weave or fiber cloth. Components are then attached, for instance, by soldering, press-fit connectors, etc., onto the printed circuit board to both electrically connect and mechanically fasten the components to the board. A basic circuit board layer or subassembly can include a flat sheet of insulating material, with a layer of conductive foil laminated to the substrate. Chemical etching divides the foil into separate conductive lines, traces, paths, for connections, vias to pass connections between layers of copper, etc. A circuit board design can have many conductive layers. A multilayer circuit board sandwiches additional conductive layers between layers of insulating material. Conductors on different layers are connected with vias within the circuit board, which can be, for instance, copper-plated holes that function as electrical tunnels through the insulating substrate. Through-hole component leads also sometimes function as vias connecting multiple layers within a multilayer circuit board.

In many circuit board layouts, multiple layers can be dedicated as power supply and ground planes. Depending on the implementation, there can be one or more power domains and a number of power supply planes, or power planes, within the circuit board. Typically, the power and ground plane shapes are wider than signal traces. For instance, in one or more embodiments of a multilayer circuit board, an entire layer can be mostly solid conductor (such as copper) to act as a ground plane for both shielding and power return, except in the region of any connecting via or through-hole via. Additionally, the power plane(s) can be designed, in one or more implementations, as a substantially rectangular-shaped conductor plane sized to supply power, for instance, from a source location on the power plane to one or more sink locations.

Modern circuit boards can be designed with a dedicated circuit board design (or layout) tool or software, generally in the following steps: a schematic capture through an electronic design automation (EDA) tool occurs, hard dimensions and template are decided based on required circuitry, and in the case of the circuit board, positions of the components and heat sinks are determined, and a layer stack of the circuit board is decided. Location of ground-to-power planes are decided. A power plane is the counterpart to the ground plane and behaves as an AC signal ground, while providing DC power to the circuits mounted on the printed circuit board. Signal interconnections are traced on signal planes. Signal planes can be on the outer as well as inner layers, line impedance is determined using dielectric layer thickness, routing copper thickness, and trace width. Components are placed, and thermal considerations and geometry are taken into account, including vias and lands being marked. Signal traces are routed, and electronic design automation tools typically create layout clearances and connections in power and ground planes automatically, based on specified rules documented in one or more design libraries. Gerber files can then be generated for manufacturing the resultant circuit board design. As is known, a variety of processes are used during the fabrication of a circuit board including, for instance, subtractive, additive, and semi-additive processes, chemical etching, lamination, drilling, plating and coating, and solder-resist application and assembly of the resultant circuit board.

Figure 2:
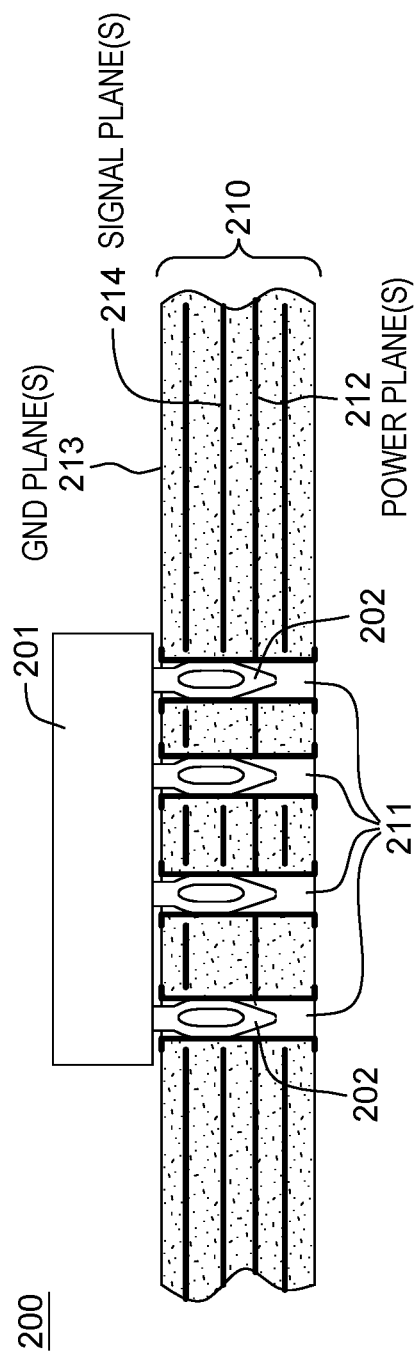
FIG. 2 is a partial cross-sectional elevational view of one embodiment of a circuit board assembly to include and/or use one or more aspects of the present invention.

By way of example, FIG. 2 depicts one embodiment of a circuit board assembly, generally denoted 200, such as a printed circuit board assembly, which includes a multilayer circuit board 210 and one or more components 201 operatively coupled to a surface of multilayer circuit board 210. In one or more implementations, component(s) 201 is operatively coupled to multilayer circuit board 210 by a plurality of connector pins, such as a plurality of press-fit pins 202 pressed into respective apertures 211, or connect vias, such as respective plated through-holes, of multilayer circuit board 210. Within multilayer circuit board 210, one or more power planes 212 can be provided, as well as one or more ground planes 213. Further, multilayer circuit board 210 can include one or more signal trace layers 214 for interconnecting and electrically routing signals between, for instance, multiple components 201 attached to multilayer circuit board 210.

In one or more embodiments, use of press-fit technology in circuit board assemblies involves insertion of connector pins, or press-fit pins, into apertures, or connect vias, of a multilayer circuit board, such as plated through-holes of a multilayer circuit board. The resultant press-fit connections provide reliable interconnects without requiring soldering. The diameter of a press-fit interaction, or deformation, zone can be greater than the diameter of the aperture, that is, the interaction or deformation zone can extend into the multilayer circuit board with insertion of the press-fit pin into the aperture. During the press-fit process, the mechanical deformation is principally within the compliant pin, but also, a certain amount of interaction or deformation can occur in the aperture barrel (e.g., plated through-hole), and surrounding circuit board laminate.

Figure 3D:
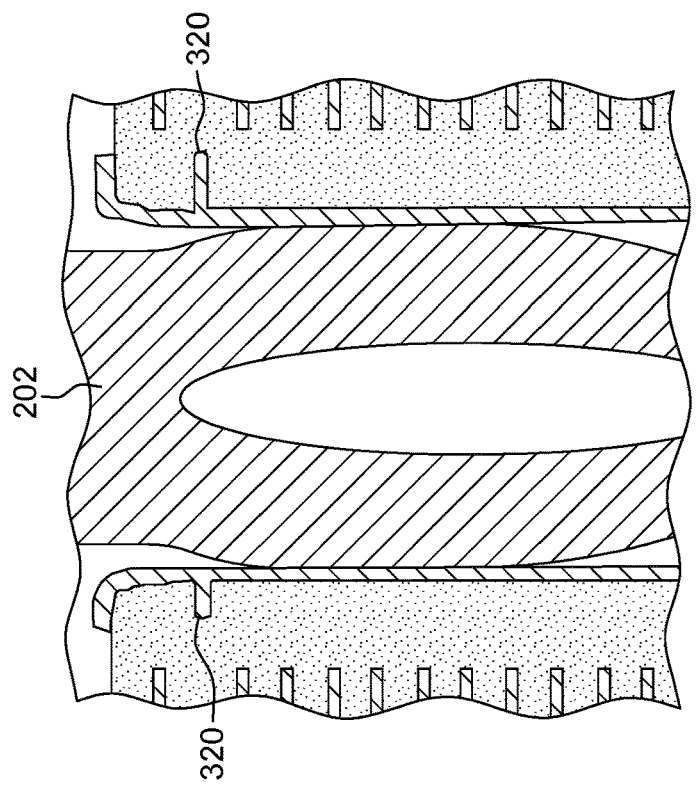

By way of example, FIGS. 3A & 3B depict one embodiment of an eye-of-the-needle-type connector pin 202, or terminal pin, with a compliant press-fit region 300, being inserted into an aperture 211, such as a plated through-hole, of multilayer circuit board 210. Note that eye-of-the-needle-type connector pin 202 illustrated in FIGS. 3A-3D, is shown by way of example only. Other compliant connector pins with differently sized and/or configured press-fit regions can be utilized to establish a reliable press-fit connection between, for instance, a connector pin of the component and a respective aperture of the multilayer circuit board. FIG. 3B depicts the resultant connection with connector pin 202 residing within aperture 211 of multilayer circuit board 210, shows a direction of greatest normal force F outward from the aperture with insertion of the connector pin with compliant press-fit region 300. During the press-in process, the press-fit region absorbs the deformation of the press-fit pin, and thus the connector pin is tightly connected within the plated through-hole, forming a reliable connection, including reliable electrical and mechanical connections.

Figure 3C:
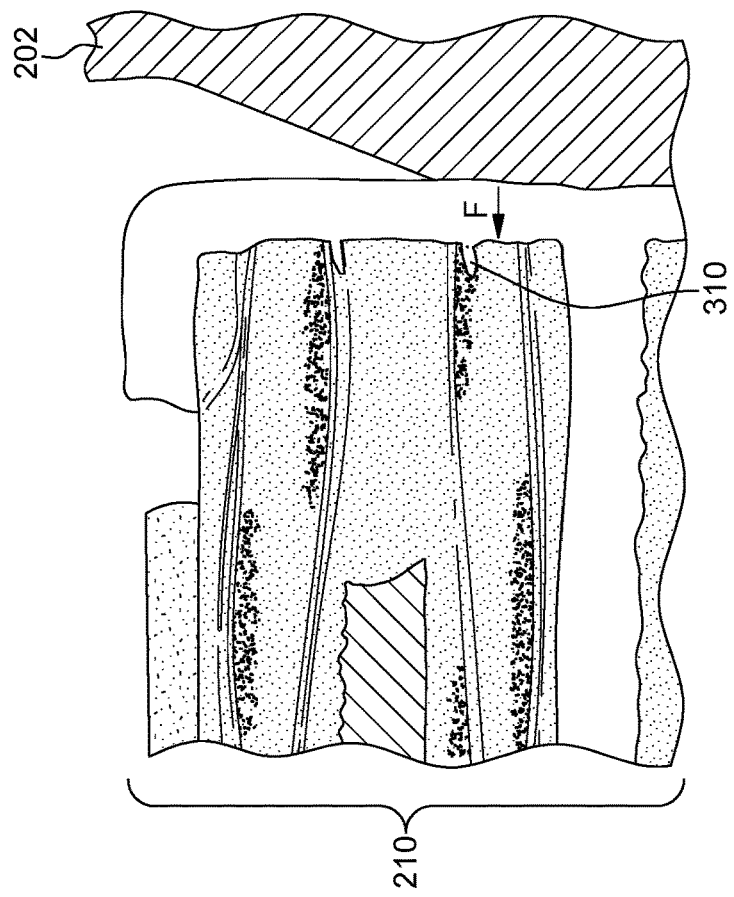

As example only, FIGS. 3C & 3D depict damage that could occur as a result of one or more press-fit connections being made into an aperture of a multilayer circuit board. As illustrated in FIG. 3C, connector pin insertion can (in certain cases) result in laminate cracking 310 of the multilayer circuit board due to an outward, normal force F being exerted from the connector pin 201 through the aperture 211 into the surrounding layers of the circuit board. The problem can be exacerbated where a multilayer circuit board assembly has been reworked, with removal and reinsertion of one or more press-fit pins having occurred. In the example of FIG. 3C, potential laminate cracking 310 is illustrated between layers of the multilayer circuit board resulting from the connector pin insertion. This localized damage in the multilayer circuit board in the region of pin contact can allow conduct anodic filament (CAF) growth within the damaged dielectric. Also, the issue may not be captured at time-zero testing, but rather may be a latent failure that can occur over time in the field. An example of CAF growth 320 along fractured layers of a multilayer circuit board is depicted in FIG. 3D. Laminate cracking and other deformation within the multilayer circuit board can be further exacerbated where the connector pin encounters a nodule, such as at or near the insertion surface of the board, resulting in a greater force being generated within the insertion zone. Also, in one or more implementations, any existing voids and/or other laminate resin fill deficiencies can combine with press-fit damage in the zone of connector pin-to-aperture interaction to reduce or impair the continuous dielectric spacing between conductors within the multilayer circuit board about the aperture.

Press-fit-induced cracking has been identified in dielectric material between inserted connector pin(s) and the surrounding internal planes of the multilayer circuit board with standard antipad clearances. In certain cases, cracking along fiber bundles of the circuit board can form a potential CAF leakage path between an aperture, or connect via, and internal planes, such as internal ground or power planes of the multilayer circuit board. The damage risk can be aggravated by any flaws or out-of-specification conditions, including out-of-specification hole sizes, out-of-specification press-fit pin sizes, dielectric voiding, de-wetting of glass bundles within the multilayer circuit board, and plating nodules or other copper-plated through-hole plating conditions that aggravate a failure risk. This press-fit insertion issue can be more significant in the case of power routing-related apertures and pins. Industry specifications, such as the IPC-A-600K Guide for circuit boards, and the IPC-A-610G Guide for circuit board assemblies, set forth standards which define electrical clearance requirements, including around an aperture, or connector via, such as a plated through-hole. Minimum tolerances are typically specified in order to provide a guide for printed circuit board acceptability. Aperture-surrounding keep-out regions, or clearance regions, for press-fit connections can be enhanced as described herein from the industry standards.

In one or more aspects, disclosed herein are methods of fabricating a multilayer circuit board, and circuit board assemblies, as well as computer-implemented methods, computer systems and computer program products, where program code executing on one or more processors improves processing and performance within a computing environment by facilitating fabrication of a multilayer circuit board, including producing, using a circuit board design tool, a circuit board layout for a multilayer circuit board being fabricated.

In one or more aspects, the method of fabricating the multilayer circuit board includes forming a layer of the multilayer circuit board with an internal clearance region having a modified voltage-to-ground clearance of conductive material adjacent to an aperture of the multilayer circuit board. The modified voltage-to-ground clearance of conductive material is based on a configuration of the connector pin to be press-fit connected within the aperture of the multilayer circuit board, and the internal clearance region is enlarged in a direction of greatest normal force outward from the aperture with insertion of the connector pin into the aperture. Advantageously, the modified voltage-to-ground clearance of the conductive material adjacent to the aperture of the multilayer circuit board enhances critical clearances between conductors, such as power and ground conductors within the multilayer circuit board, and thereby enhances product reliability and integrity in a multilayer circuit board assembly using connector pins to, for instance, couple a component to the multilayer circuit board.

In one or more implementations, the internal clearance region includes an elongated clearance region about the aperture in the layer, with the longer axis of the elongated clearance region being oriented based, at least in part, on configuration of the connector pin to be received in the aperture to provide enhanced clearance between conductive material in the direction of greatest normal force outward from the aperture with insertion of the connector pin into the aperture. The elongated clearance region around the aperture advantageously provides an enhanced clearance region or area in the layer to ensure there is sufficient dielectric material between conductive materials, such as between non-common power and ground conductors of the multilayer circuit board, notwithstanding possible deformation of the multilayer circuit board with insertion of the connector pin.

In one or more embodiments, forming the layer further includes orienting the longer axis of the elongated clearance region based on the configuration and an orientation of the connector pin to be received in the aperture to provide enhanced clearance between the conductive material in the direction of greatest normal force outward from the aperture with insertion of the connector pin into the aperture.

In one or more implementations, the aperture is a power-routing-related via of the multilayer circuit board, and the elongated clearance region defines an enhanced voltage-to-ground clearance between the power-routing-related via and a conductor in a respective layer of the multilayer circuit board. Product reliability and integrity are improved by defining the enhanced voltage-to-ground clearance between the power-routing-related via and the conductor in the respective layer of the multilayer circuit board.

In one or more implementations, the method further includes inserting the connector pin into the aperture of the multilayer circuit board to couple a component to the multilayer circuit board. The inserting can produce deformation in the layer of the multilayer circuit board in the direction of greatest normal force outward from the aperture with insertion of the connector pin into the aperture, and the elongated clearance region provides the enhanced clearance between conductive material in the direction of greatest normal force outward from the aperture, providing a reduced risk of electrical shorting occurring based on any deformation caused by the connector pin insertion. By reducing the risk of electrical short occurring based on deformation of one or more layers of the multilayer circuit board caused by the connector pin insertion, more reliable printed circuit board assemblies are provided.

In one or more other aspects, a circuit board assembly is provided which includes a component with one or more connector pins, and a multilayer circuit board with one or more apertures. The one or more connector pins of the component are press-fit connected within the one or more apertures of the multilayer circuit board. The multilayer circuit board includes an internal clearance region in a layer of the multilayer circuit board, adjacent to an aperture of the one or more apertures, with a modified voltage-to-ground clearance of conductive material based on configuration of a respective connector pin of the one or more connector pins. The configuration of the respective connector pin indicates a direction of greatest normal force outward from the aperture with insertion of the connector pin therein, and the internal clearance region is enlarged, at least in part, in the direction of greatest normal force outward from the aperture. By enhancing voltage-to-ground clearance of conductive material based on configuration of the respective connector pin, enhanced product reliability and integrity of the multilayer circuit board assembly are obtained using the connector pin to, for instance, couple the component to the multilayer circuit board.

In one or more implementations, disclosed herein are novel processes for enhancing printed circuit board layout for connector pin-to-aperture applications. In one or more embodiments, the enhanced layout provides a process to optimize critical clearances between, for instance, power and ground conductors and surrounding antipads about an aperture. The processes disclosed improve processing and performance within a computing environment, including enhancing critical clearances between conductors, such as power and ground conductors within a multilayer circuit board, and thereby enhance product reliability and integrity in a multilayer circuit board assembly using connector pins to, for instance, couple a component to the multilayer circuit board.

Figure 4:
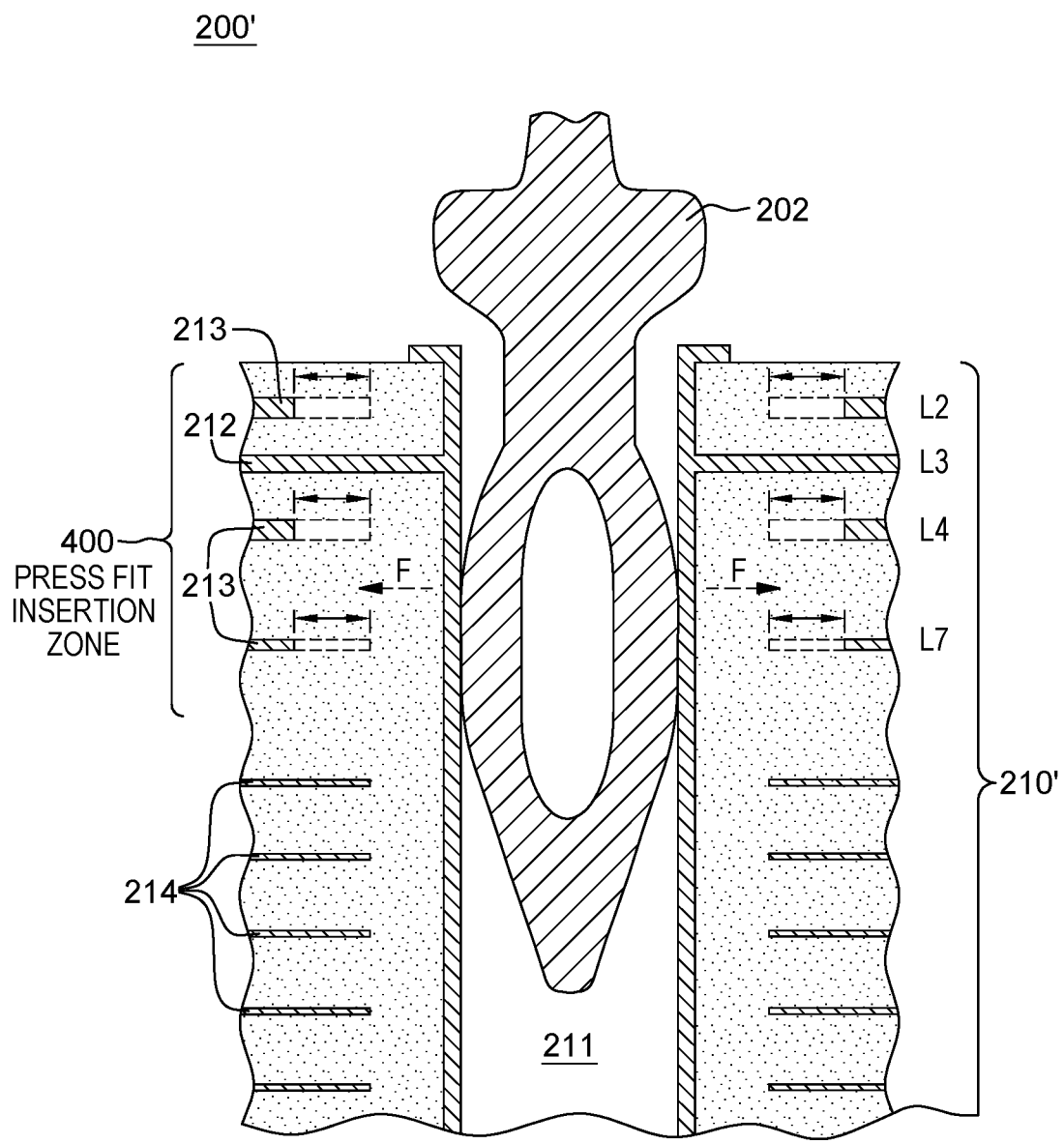
FIG. 4 is a partial cross-sectional elevational view of one embodiment of a multilayer circuit board assembly with enhanced internal clearance regions around an aperture within a connector pin-to-aperture interaction zone, in accordance with one or more aspects of the present invention.

By way of example, FIG. 4 is a partial cross-sectional elevational view of a printed circuit board assembly 200', with connector pin 202 shown press-fit into a respective aperture 211, such as a respective plated through-hole of a multilayer circuit board 210'. As illustrated, multilayer circuit board 210' includes a plurality of layered planes of dielectric and conductive material including, for instance, a power plane 212, ground planes 213, as well as multiple signal planes 214. In the embodiment illustrated, power plane 212 is electrically connected to the conductive material within aperture 211, by way of example only.

In one or more implementations, program code identifies a connector pin-to-aperture interaction zone 400, which extends into multilayer circuit board 210' from a surface of the multilayer circuit board, such as a surface to which the associated component (not shown) is mounted via one or more connector pins 202. In one or more implementations, as connector pin 202 is inserted into aperture 211, a normal force F outward from the aperture is experienced from upper surface of the multilayer circuit board 210' to the final position of the connector pin within the aperture. In one embodiment, this normal force defines interaction zone 400, or insertion zone, within which one or more internal clearance regions of the multilayer circuit board about aperture 211 can be enhanced, such as described herein.

In one embodiment, interaction zone 400 is the area of multilayer circuit board 210', from the surface of the board to the final insertion contact position of the connector pin within the aperture, within which deformation of the layered planes can principally occur from the outward, normal force F exerted by the inserted pin. A similar interaction zone can be determined for any type of compliant press-fit pin technology used in the circuit board assembly manufacturing process. By way of example only, in the embodiment of FIG. 4, layer L2 can be a ground plane 213 that has a critical antipad clearance to, for instance, aperture 211 containing press-fit connector pin 202, which as noted (in one embodiment) can be a power pin, such as a 12 volt power pin. Layer L3 can be a power plane 212 which directly, electrically connects to the aperture, or plated through-hole, and hence, to connector pin 202 operatively positioned within the aperture. In addition, in the depicted embodiment, layers L4 and L7 have conductive material, for instance, as part of respective ground planes 213, that is also provided with enhanced clearance, at least in part, in a direction based on the configuration (and size and orientation) of connector pin 202 within the multilayer circuit board, and in particular, based on the normal force F applied by connector pin 202 within interaction zone 400.

By way of example, FIGS. 5A-5D depict one embodiment of an industry-specified antipad clearance about an aperture or connector via (FIG. 5A) of a multilayer circuit board assembly, and selectively enhanced, or customized, clearance regions (FIGS. 5B-5D) about the aperture, in accordance with one or more aspects of the present invention.

Figure 5A:
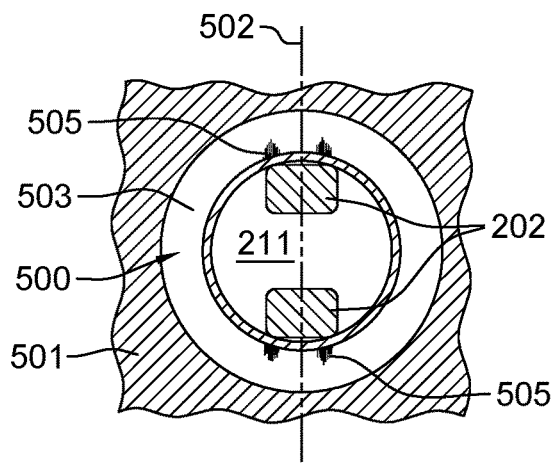
FIG. 5A is a partial cross-sectional plan view depicting a layer of a circuit board assembly, and illustrating one embodiment of an eye-of-the-needle-type connector pin within an aperture of the multilayer circuit board, and showing a normal force direction with potential laminate cracking, which is addressed by one or more aspects of the present invention.

In FIG. 5A, an industry-specified antipad clearance region 500 is illustrated between conductive material 501 of a layer of the multilayer circuit board and an aperture 211, such as a conductive via or plated through-hole, accommodating a connector pin 202, such as an eye-of-the-needle-type press-fit pin. As illustrated, the eye-of-the-needle-type press-fit connector outputs greatest normal force F outward from aperture 211 along an axis 502, which results in regions 505 within dielectric material 503 separating conductive material 501 and aperture 211 with greatest chance of being compromised, which as noted, can potentially result in a reliability or integrity issue for the printed circuit board assembly.

Figure 5B:
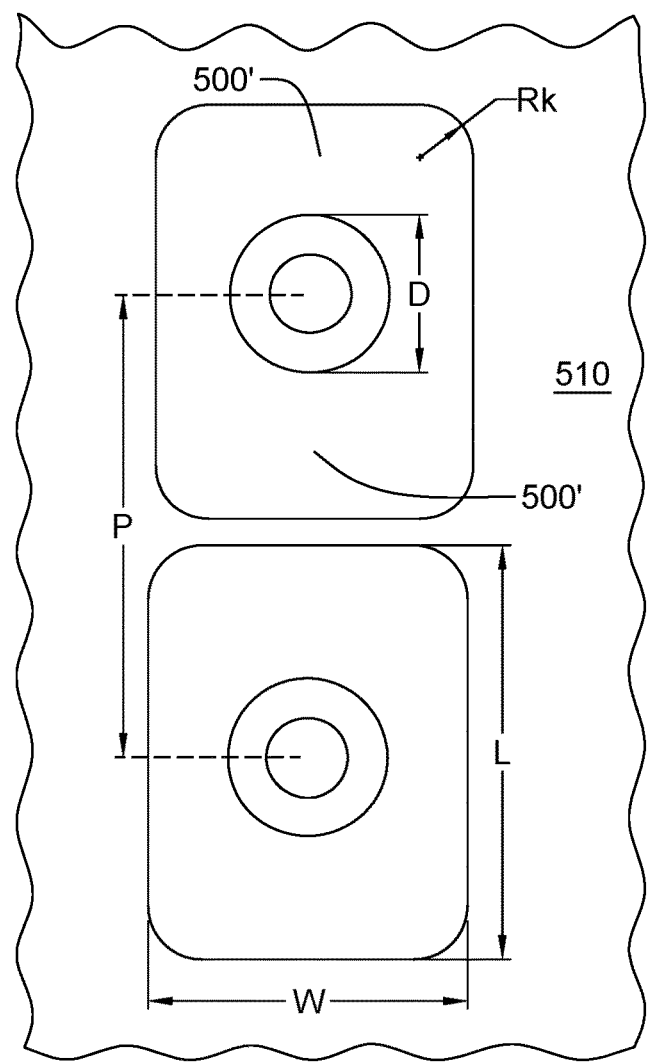
FIG. 5B is a partial schematic of one embodiment of a layout of a multilayer circuit board and pin assembly, with certain internal regions of the multilayer circuit board surrounding selected apertures modified with enhanced clearance, that is oriented based on connector pin configuration, in accordance with one or more aspects of the present invention.

FIG. 5B is a partial schematic of one embodiment of a layout 510, or layout geometry, for a multilayer circuit board assembly such as discussed herein, with certain internal clearance regions of the multilayer circuit board surrounding selected apertures being modified or customized with enhanced clearance 500' that is oriented based on the particular press-fit connector configuration and orientation within the board. The schematic of FIG. 5B assumes that the press-fit connector is an eye-of-the-needle-type press-fit pin oriented as illustrated in FIG. 5A. In one embodiment, enhanced clearance 500' can be an elongated internal clearance region, such as a rectangular-shaped antipad, with rounded corners. In one embodiment only, the elongated clearance region can have a width W defined, for instance, as 0.204+1.05D, where D is the diameter of the drilled hole of the aperture. The length of the elongated clearance region L can be defined, in one embodiment, as 0.90 P, where P is the pitch distance between adjacent or neighboring apertures in layout 510. In one embodiment, the corners of the rectangular-shaped, elongated clearance region 500' of FIG. 5B can be rounded with a radius Rk defined as the radius of the keep-out clearance shape in the corners. Note that the eye-of-the-needle connector pin configuration and illustrated orientation are one example only of a compliant connector pin and orientation that can be referenced in creating certain elongated clearance regions in the interaction zone within the multilayer circuit board assembly.

Figure 5C:
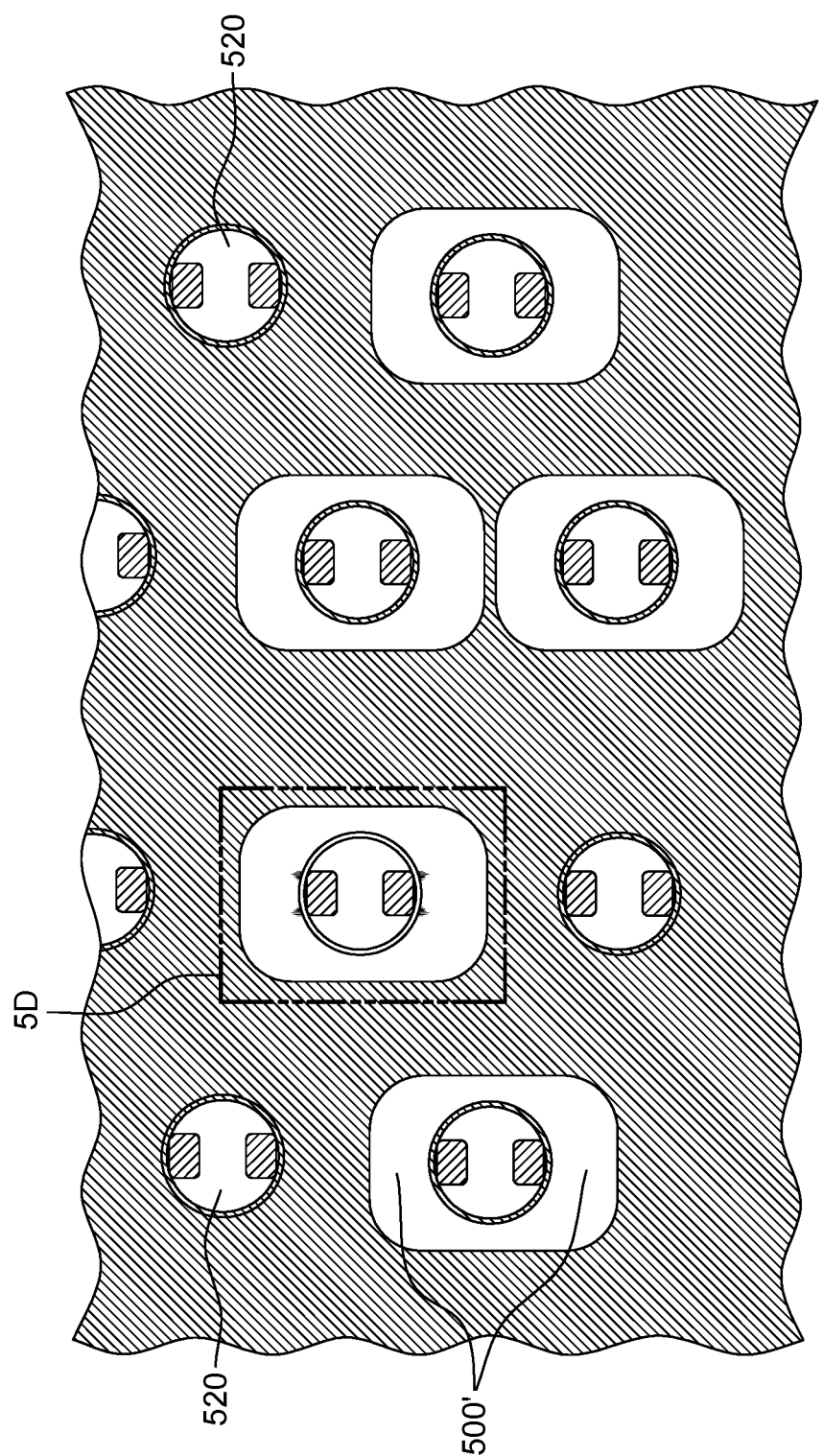
FIG. 5C is a partial cross-sectional plan view of one embodiment of a circuit board assembly layer with elongated clearance regions surrounding selected apertures, which provide enhanced conductor clearance in a direction of greatest normal force outward from the eye-of-the-needle-type connector pins within the selected apertures, in accordance with one or more aspects of the present invention.
Figure 5D:
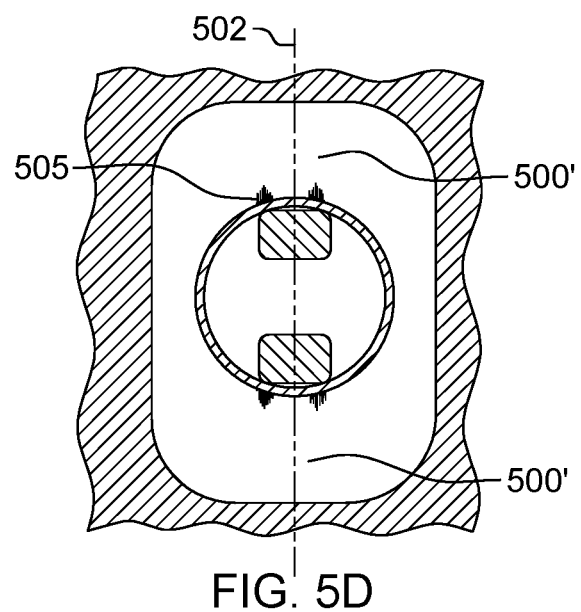
FIG. 5D is an enlarged partial cross-sectional plan view of the circuit board assembly layer of FIG. 5C, taken along line 5D, showing the elongated internal clearance region about the aperture, and depicting the eye-of-the-needle-type connector pin residing within the aperture, in accordance with one or more aspects of the present invention.

FIG. 5C is a partial cross-sectional plan view of one embodiment of a circuit board assembly layer with elongated clearance regions surrounding selected apertures providing, for instance, power or ground connections to the multilayer circuit board, and FIG. 5D is an enlarged depiction of one enhanced internal clearance region for the eye-of-the-needle-type connector pin, in accordance with one or more aspects of the present invention.

Referring collectively to FIGS. 5C & 5D, in one embodiment, the layout can be reviewed by program code for application of enhanced clearance regions at selected apertures within interaction zones of the connector pins to be connected to the multilayer circuit board. The layers of the multilayer circuit board within the expected interaction zone, or insertion depth, of the press-fit pins can have (at least) their voltage-to-ground clearance regions modified with enhanced clearance between conductor materials. As described, the enhanced clearance regions can be specified based on configuration, size, and orientation of the particular connector pin type being received in the respective aperture, with an eye-of-the-needle-type connector pin being illustrated in FIGS. 5A-5D, by way of example only. As illustrated in FIG. 5C, in one or more implementations, only selected apertures, such as power-routing-related apertures, are reconfigured or modified by the program code with enhanced internal clearance regions, dependent on the connector pin type to be inserted in the printed circuit board assembly. In this manner, enhanced voltage-to-ground clearances can be readily provided between non-common power and ground conductive materials.

As illustrated in FIG. 5C, other apertures, such as apertures 520, may not require an extended clearance region. For instance, in one embodiment, conductive material 501 can be a ground plane conductor within the multilayer circuit board, with apertures 520 being plated through-holes electrically connected to the ground plane material, and apertures with enhanced clearance 500' can be, in one example, power-related vias connecting to a different, power plane level of the multilayer circuit board.

In one or more implementations, the extended clearance is aligned with the direction of greatest normal force F outward from the respective aperture with insertion of the connector pins, which as illustrated in FIG. 5A, is along axis 502 in the case of eye-of-the-needle-type pin oriented as shown. Note that this particular layout assumes that the configuration, size and orientation of the compliant press-fit pin to be inserted within the aperture are known during design layout. The enhanced clearance in the press-fit region of most-likely deformation provides a greater dielectric margin to ensure that there is uncompromised dielectric, even with moderate press-fit laminate cracking 505 (FIG. 5A). This in turn results in a more reliable printed circuit board assembly because sufficient dielectric material continues to reside between non-common power and ground conductors within the multilayer circuit board. By providing a selectively enlarged region of uncompromised dielectric material within the antipad, product reliability and integrity are thereby enhanced.

FIGS. 5E-5H depict another embodiment of an industry-specified antipad clearance about an aperture or connector via (FIG. 5E) of a multilayer circuit board assembly, and selectively enhanced, or customized, clearance regions (FIGS. 5F-5H) about the aperture, in accordance with one or more aspects of the present invention. In this embodiment, the connector pin is a compliant action-type connector pin 202', by way of further example.

Figure 5E:
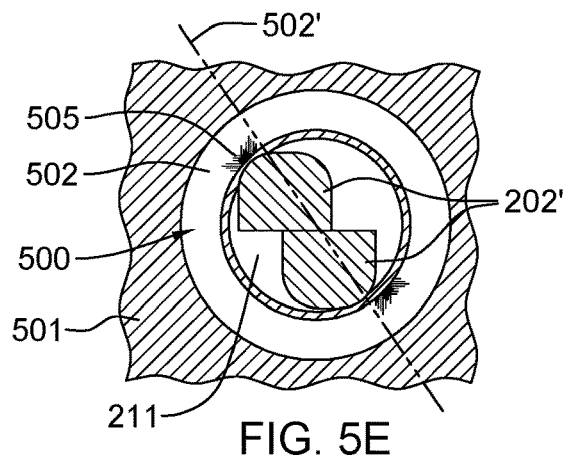
FIG. 5E is another partial cross-sectional plan view depicting a layer of a circuit board assembly, and illustrating one embodiment of an action-type connector pin within an aperture of the multilayer circuit board, and showing a normal force direction with potential laminate cracking, which is addressed by one or more aspects of the present invention.

In FIG. 5E, an industry-specified antipad clearance region 500 is illustrated between conductive material 501 of a layer of a multilayer circuit board and aperture 211, such as a conductive via or plated through-hole, accommodating a connector pin 202', such as an action-type connector pin. As illustrated, the action-type connector pin outputs greatest normal force F outward from aperture 211 along an axis 502', which results in regions 505 within dielectric material 503 separating conductive material 501 and aperture 211, with greatest change of being compromised, which as noted, can potentially result in a reliability or integrity issue for the printed circuit board assembly.

Figure 5F:
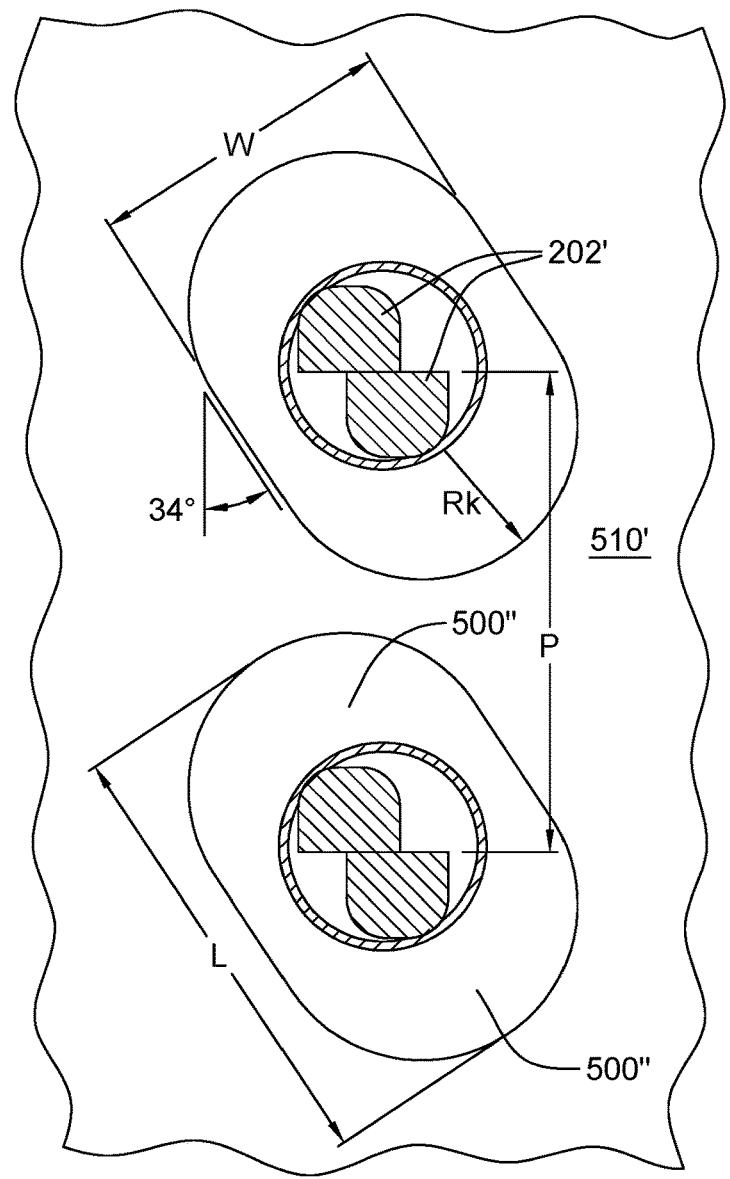
FIG. 5F is a partial schematic of one embodiment of a layout of a multilayer circuit board and pin assembly, with certain internal regions of the multilayer circuit board surrounding selected apertures modified with enhanced clearance, that is oriented based on connector pin configuration, in accordance with one or more aspects of the present invention.
Figure 5G:
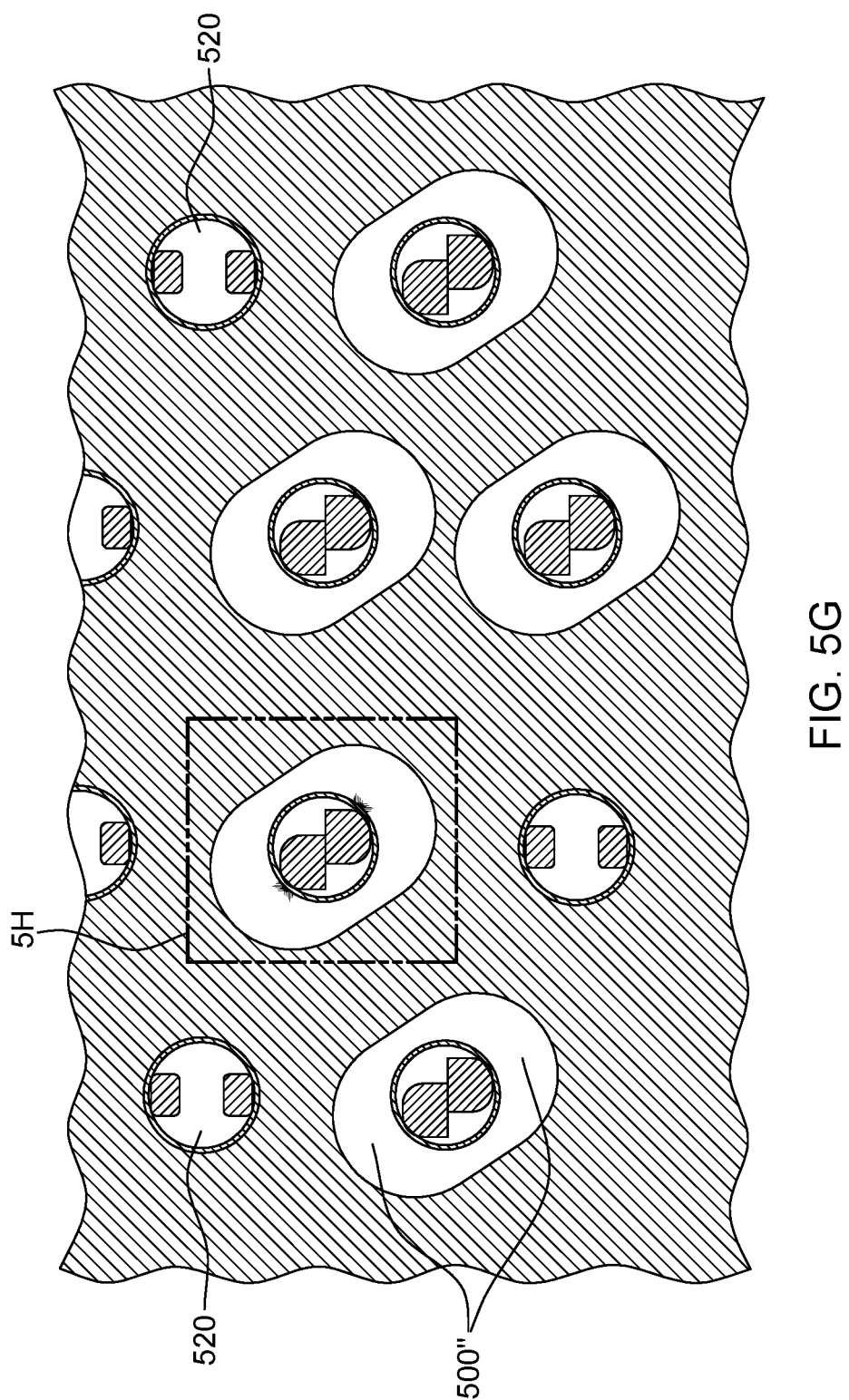
FIG. 5G is a partial cross-sectional plan view of one embodiment of a circuit board assembly layer with elongated clearance regions surrounding selected apertures, which provide enhanced conductor clearance in a direction of greatest normal force outward from the action-type connector pins within the selected apertures, in accordance with one or more aspects of the present invention.

FIG. 5F is a partial schematic of one embodiment of a layout 510', or layout geometry, for a multilayer circuit board such as discussed herein, with certain internal clearance regions of the multilayer circuit board surrounding selected apertures being modified or customized with an enhanced clearance 500" that is oriented based on the particular press-fit connector configuration and orientation within the board. The schematic of FIG. 5F assumes that the press-fit connector is an action-type press-fit connector oriented as illustrated in FIG. 5E. In one embodiment, the enhanced clearance 500" can be an elongated internal clearance region, such as oblong region, or if desired, rectangular-shaped region. In one embodiment, the elongated clearance region has a width, length, and pitch defined by the rules noted above in connection with FIG. 5B, with a couple modifications. With an action-type connector pin, the location of the enhanced clearance region is angled to utilize space between adjacent pins. This angling can be, in one embodiment, 34 degrees for interstitial grid pin arrays, such as illustrated in the examples of FIGS. 5F & 5G. Further, in the embodiment of FIG. 5F, for an action-type connector pin, the enhanced clearance region can have a shape radius Rk=0.5 W, in one embodiment.

Figure 5H:
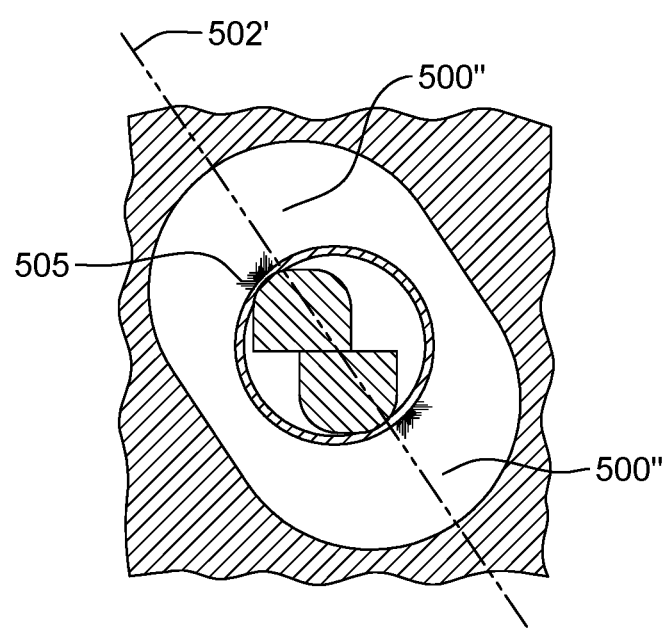
FIG. 5H is an enlarged partial cross-sectional plan view of the circuit board assembly layer of FIG. 5G, taken along line 5H, showing the elongated internal clearance region about the aperture, and depicting the action-type connector pin residing within the aperture, in accordance with one or more aspects of the present invention.

FIG. 5G is a partial cross-sectional plan view of one embodiment of a circuit board assembly layer with elongated clearance regions surrounding selected apertures providing, for instance, power or ground connections to the multilayer circuit board, and FIG. 5H is an enlarged depiction of one enhanced internal clearance region for the action-type connector pin, such as discussed herein.

Referring collectively to FIGS. 5G & 5H, in one embodiment, the layout can be reviewed by program code for application of enhanced clearance regions at selected apertures within interaction zones of connector pins to be connected to the multilayer circuit board. In one embodiment, the layers of the multilayer circuit board within the expected interaction zone, or insertion depth, of the press-fit pin(s) can have (at least) their voltage-to-ground clearance regions modified with enhanced clearance between conductor materials, such as illustrated in FIG. 5F. As described, the enhanced clearance regions can be specified based on configuration, size, and orientation of the particular connector pin type being received in the respective aperture, with the action-type connector pin being illustrated in FIGS. 5E-5H, by way of example only. As illustrated in FIG. 5G, other apertures, such as apertures 520, may not require an extended clearance region. For instance, in one embodiment, conductive material 501 (FIG. 5E) can be a ground plane conductor within the multilayer circuit board, with apertures 520 being plated through-holes electrically connected to the ground plane material. Apertures with the enhanced clearance 500" can be, in one example, power-related vias connecting to a different power plane level of the multilayer circuit board.

As with the extended clearances of FIGS. 5B-5D, the extended clearances of FIGS. 5F-5H are aligned, in one or more implementations, with the direction of greatest normal force F outward from the aperture with insertion of the connector pins, which as illustrated in FIG. 5E, is along axis 502', in the case of an action-type pin oriented as shown. Note that this particular layout assumes that the configuration, size and orientation of the compliant press-fit pin to be inserted within a particular aperture are known during layout design, with the typical press-fit laminate deformation or cracking most likely occurring within the region of extended clearance in the modified layout of FIGS. 5F-5H, in one embodiment. The elongated clearance in the interaction zone of most likely deformation provides an enhanced margin to ensure that there is uncompromised dielectric, even with moderate press-fit laminate cracking. This in turn, results in more reliable printed circuit board assemblies because sufficient dielectric material continues to reside, particularly between non-common power and ground conductors, within the multilayer circuit board. By providing the selectively enlarged region(s) of uncompromised dielectric material within the antipad region, product reliability and integrity are improved.

Figure 6:
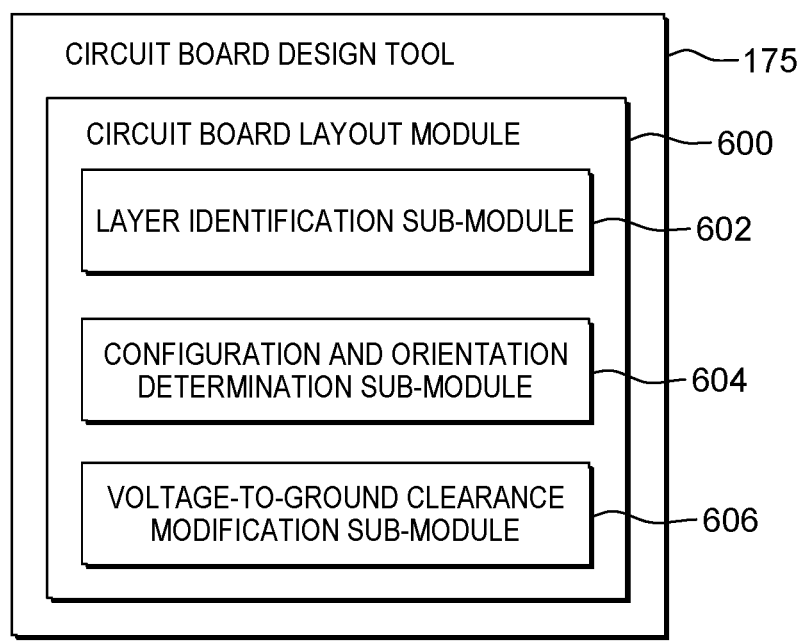
FIG. 6 depicts one embodiment of a computer program product, in accordance with one or more aspects of the present invention.

Further details of embodiments of facilitating processing within a computing environment, as it relates to one or more aspects of the present invention, are described below with reference to the embodiments of FIGS. 6 & 7.

As noted herein, in one or more aspects, a computer-implemented methods, computer systems and computer program products are provided for facilitating producing a multilayer circuit board layout. By way of example, FIG. 6 depicts one embodiment of such a computer program product, in accordance with one or more aspects of the present invention. As illustrated, in one or more embodiments, the computer program product includes or utilizes a circuit board design tool 175 which includes, for instance, program instructions embodied therewith. The program instructions are readable by a processing circuit, such as processing circuitry 120 of computer 101 of computing environment 100 of FIG. 1, to perform a method. The program instructions or program code include, in one embodiment, a circuit board layout module 600 which includes program code, which when read and executed by the processing circuit, cause the processing circuit to produce a circuit board design layout for a multilayer circuit board being fabricated. In the embodiment depicted, the circuit board layout module 600 includes a layer identification sub-module 602 to facilitate identifying a layer of the multilayer circuit board with an internal clearance region about an aperture of the multilayer circuit board having a voltage-to-ground clearance of conductive material to be modified. Further, the circuit board layout module 600 includes, in the example of FIG. 6, a configuration and orientation determination sub-module 604, which includes program code to determine a configuration and orientation of a connector pin to be press-fit connected within the aperture of the multilayer circuit board. Further, the circuit board layout module 600 includes a voltage-to-ground clearance modification sub-module 606, which includes program code to modify the voltage-to-ground clearance of conductive material in the internal clearance region in the layer about the aperture based on the determined configuration and orientation of the connector pin to be press-fit connected within the aperture of the multilayer circuit board, where the voltage-to-ground clearance is modified in a direction of greatest normal force outward from the aperture with insertion of the connector pin into the aperture. In one or more implementations, one or more aspects of circuit board design tool 175, including circuit board layout module 600 and the noted sub-modules, can be implemented in one or more libraries of the circuit board design tool, such as a library of a computer-aided design system. Note in this regard that, in one or more embodiments, orientation of a pin can be specified as a known attribute in the library based on, for instance, part number of the connector pin. Further, note that different components to be connected to the multilayer circuit board can use different connector pin types, depending on the implementation, and thereby have different part numbers associated therewith.

Figure 7:
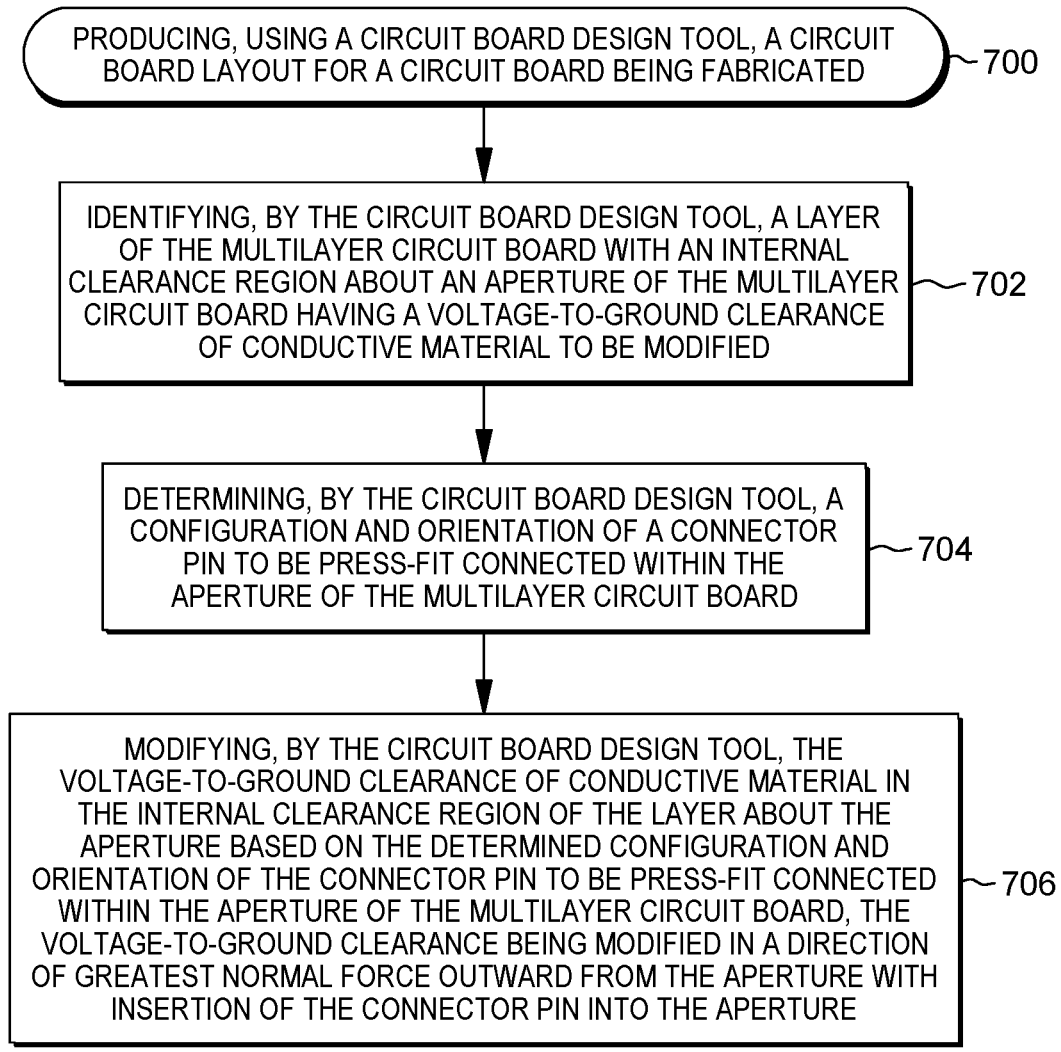
FIG. 7 depicts one embodiment of a workflow, in accordance with one or more aspects of the present invention.

FIG. 7 depicts one embodiment of a circuit board design layout workflow, in accordance with one or more aspects of the present invention. As illustrated, in one or more implementations, producing the circuit board layout for the circuit board being fabricated 700 includes identifying, by the circuit board design tool, a layer of the multilayer circuit board with an internal clearance region about an aperture of the multilayer circuit board having a voltage-to-ground clearance of conductive material to be modified 702. Further, producing the circuit board layout includes determining, by the circuit board design tool, a configuration and orientation of a connector pin to be press-fit connected within the aperture of the multilayer circuit board 704. In addition, producing the circuit board layout includes modifying, by the circuit board design tool, the voltage-to-ground clearance of conductive material in the internal clearance region of the layer about the aperture based on the determined configuration and orientation of the connector pin to be press-fit connected within the aperture of the multilayer circuit board, where the voltage-to-ground clearance is modified in a direction of greatest normal force outward from the aperture with insertion of the connector pin into the aperture 706.

Figure 8:
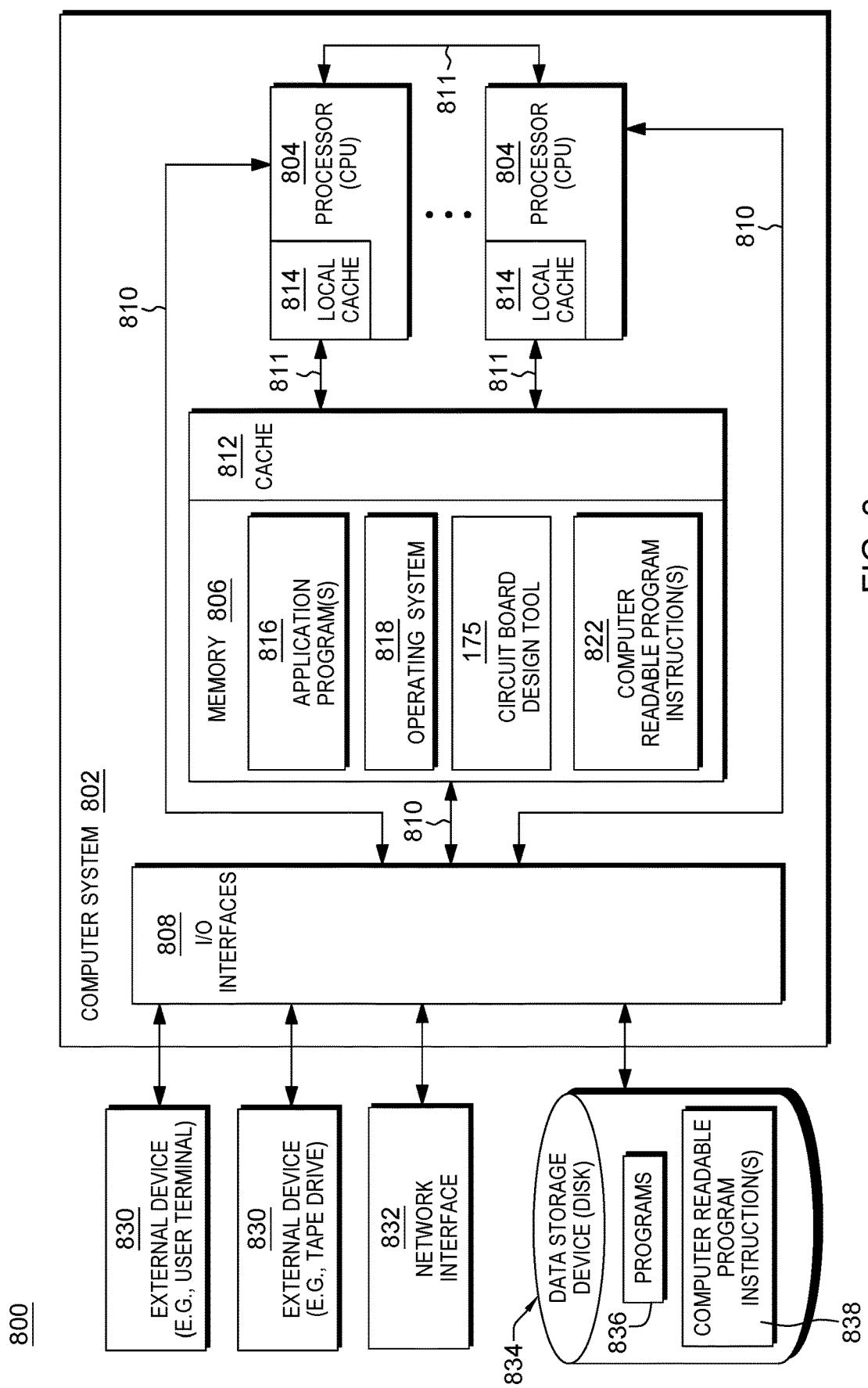
FIG. 8 depicts another embodiment of a computing environment to include and/or use one or more aspects of the present invention.

Referring to FIG. 8, in another example, a computing environment 800 includes, for instance, a computer system 802 shown, e.g., in the form of a general-purpose computing device. Computer system 802 may include, but is not limited to, one or more processors or processing units 804 (e.g., central processing units (CPUs) and/or special-purpose processors, etc.), a memory 806 (a.k.a., system memory, main memory, main storage, central storage or storage, as examples), and one or more input/output (I/O) interfaces 808, coupled to one another via one or more buses and/or other connections. For instance, processors 804 and memory 806 are coupled to I/O interfaces 808 via one or more buses 810, and processors 804 are coupled to one another via one or more buses 811.

Bus 811 is, for instance, a memory or cache coherence bus, and bus 810 represents one or more of any of several types of bus structures, including a memory bus or memory controller, a peripheral bus, an accelerated graphics port, and a processor or local bus using any of a variety of bus architectures. By way of example, and not limitation, such architectures include the Industry Standard Architecture (ISA), the Micro Channel Architecture (MCA), the Enhanced ISA (EISA), the Video Electronics Standards Association (VESA) local bus, and the Peripheral Component Interconnect (PCI).

Memory 806 may include, for instance, a cache 812, such as a shared cache, which may be coupled to local caches 814 of one or more processors 804 via, e.g., one or more buses 811. Further, memory 806 may include one or more programs or applications 816, at least one operating system 818, and circuit board design tool 175, which implements, and/or is used in accordance with, one or more aspects of the present invention, as well as one or more computer readable program instructions 822. Computer readable program instructions 822 may be configured to carry out functions of embodiments of aspects of the invention.

Computer system 802 may communicate via, e.g., I/O interfaces 808 with one or more external devices 830, such as a user terminal, a tape drive, a pointing device, a display, and one or more data storage devices 834, etc. A data storage device 834 may store one or more programs 836, one or more computer readable program instructions 838, and/or data, etc. The computer readable program instructions may be configured to carry out functions of embodiments of aspects of the invention.

Computer system 802 may also communicate via, e.g., I/O interfaces 808 with network interface 832, which enables computer system 802 to communicate with one or more networks, such as a local area network (LAN), a general wide area network (WAN), and/or a public network (e.g., the Internet), providing communication with other computing devices or systems.

Computer system 802 may include and/or be coupled to removable/non-removable, volatile/non-volatile computer system storage media. For example, it may include and/or be coupled to a non-removable, non-volatile magnetic media (typically called a "hard drive"), a magnetic disk drive for reading from and writing to a removable, non-volatile magnetic disk (e.g., a "floppy disk"), and/or an optical disk drive for reading from or writing to a removable, non-volatile optical disk, such as a CD-ROM, DVD-ROM or other optical media. It should be understood that other hardware and/or software components could be used in conjunction with computer system 802. Examples, include, but are not limited to: microcode, device drivers, redundant processing units, external disk drive arrays, RAID systems, tape drives, and data archival storage systems, etc.

Computer system 802 may be operational with numerous other general-purpose or special purpose computing system environments or configurations. Examples of well-known computing systems, environments, and/or configurations that may be suitable for use with computer system 802 include, but are not limited to, personal computer (PC) systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

The computing environments described herein are only examples of computing environments that can be used. Other environments, including but not limited to, non-partitioned environments, partitioned environments, cloud environments, distributed environments, non-distributed environments, virtual environments and/or emulated environments, may be used; embodiments are not limited to any one environment. Although various examples of computing environments are described herein, one or more aspects of the present invention may be used with many types of environments. The computing environments provided herein are only examples.

In addition to the above, one or more aspects may be provided, offered, deployed, managed, serviced, etc. by a service provider who offers management of customer environments. For instance, the service provider can create, maintain, support, etc. computer code and/or a computer infrastructure that performs one or more aspects for one or more customers. In return, the service provider may receive payment from the customer under a subscription and/or fee agreement, as examples. Additionally, or alternatively, the service provider may receive payment from the sale of advertising content to one or more third parties.

In one aspect, an application may be deployed for performing one or more embodiments. As one example, the deploying of an application comprises providing computer infrastructure operable to perform one or more aspects of one or more embodiments.

As a further aspect, a computing infrastructure may be deployed comprising integrating computer readable code into a computing system, in which the code in combination with the computing system is capable of performing one or more embodiments.

As yet a further aspect, a process for integrating computing infrastructure comprising integrating computer readable code into a computer system may be provided. The computer system comprises a computer readable medium, in which the computer medium comprises one or more embodiments. The code in combination with the computer system is capable of performing one or more embodiments.

Although various embodiments are described above, these are only examples. For example, additional, fewer and/or other features, constraints, tasks and/or events may be considered. Many variations are possible.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of one or more embodiments has been presented for purposes of illustration and description but is not intended to be exhaustive or limited to in the form disclosed. Many modifications and variations will be apparent to those of ordinary skill in the art. The embodiment was chosen and described in order to best explain various aspects and the practical application, and to enable others of ordinary skill in the art to understand various embodiments with various modifications as are suited to the particular use contemplated.

What is claimed is:

1. A circuit board assembly comprising:
a multilayer circuit board with one or more apertures, the one or more apertures being configured to receive one or more connector pins, the multilayer circuit board being press-fit connectable via the one or more connector pins and
the multilayer circuit board including an internal clearance region in a layer of the multilayer circuit board adjacent an aperture of the one or more apertures with a modified voltage-to-ground clearance of conductive material based on configuration of a respective connector pin of the one or more connector pins to accommodate any deformation of the circuit board in a direction of greatest normal force outward from the aperture with insertion of the connector pin into the aperture.

2. The circuit board assembly of claim 1, further comprising:
a component, the component being press-fit connected to the multilayer circuit board via the one or more connector pins inserted into the one or more apertures;
wherein the configuration of the respective connector pin indicates the direction of greatest normal force outward from the aperture based on insertion of the connector pin therein, and the internal clearance region being enlarged, at least in part, in the direction of greatest normal force outward from the aperture; and
wherein the internal clearance region of the layer in the multilayer circuit board adjacent to the aperture comprises an elongated clearance region around the aperture in the respective layer, with a longer axis of the elongated clearance region being oriented, based on configuration of the connector pin, to provide enhanced clearance in the direction of greatest normal force outward from the aperture with insertion of the connector pin.

3. The circuit board assembly of claim 2, wherein another internal region of the internal regions comprises a circular-shaped clearance region around the aperture with, at least in part, less offset of conductive material in the respective layer about the aperture, and wherein the elongated clearance region is within a zone of connector pin-to-aperture interaction with insertion of the connector pin into the aperture, and the other internal region is outside the zone of connector pin-to-aperture interaction.

4. The circuit board assembly of claim 2, wherein the connector pin is one connector pin type of different connector pin types, the different connector pin types comprising multiple compliant press-fit pin types, and wherein the direction of greatest normal force outward from the aperture with insertion of the connector pin varies between the different connector pin types.

5. The circuit board assembly of claim 4, wherein the multiple compliant press-fit pin types comprise an eye-of-the-needle press-fit pin type and an action press-fit pin type.

6. A method of fabricating a multilayer circuit board, the method comprising:
  forming a layer of the multilayer circuit board with an internal clearance region having a modified voltage-to-ground clearance of conductive material adjacent to an aperture of the multilayer circuit board, the modified voltage-to-ground clearance of conductive material being based on a configuration of a connector pin to be press-fit connected within the aperture of the multilayer circuit board, the internal clearance region being enlarged in a direction of greatest normal force outward from the aperture with insertion of the connector pin into the aperture to accommodate any deformation of the circuit board in the direction of greatest normal force outward from the aperture with insertion of the connector pin into the aperture.

7. The method of claim 6, wherein the internal clearance region comprises an elongated clearance region around the aperture in the layer, with a longer axis of the elongated clearance region being oriented based, at least in part, on configuration of the connector pin to be received in the aperture to provide enhanced clearance between the conductive material in the direction of greatest normal force outward from the aperture with insertion of the connector pin into the aperture.

8. The method of claim 7, wherein forming the layer further comprises orienting the longer axis of the elongated clearance region based on the configuration and an orientation of the connector pin to be received in the aperture to provide enhanced clearance between the conductive material in the direction of greatest normal forward outward from the aperture with insertion of the connector pin into the aperture.

9. The method of claim 7, wherein the aperture is a power-routing-related via of the multilayer circuit board, and the elongated clearance region defines an enhanced voltage-to-ground clearance between the power-routing-related via and a conductor in the layer of the multilayer circuit board.

10. The method of claim 7, further comprising inserting the connector pin into the aperture of the multilayer circuit board to couple a component to the multilayer circuit board, the inserting producing deformation in the layer of the multilayer circuit board in the direction of greatest normal force outward from the aperture with insertion of the connector pin into the aperture, and the elongated clearance region providing the enhanced clearance between conductive material in the direction of greatest normal force outward from the aperture, providing a reduced risk of electrical shorting occurring based on the deformation caused by the connector pin insertion.

11. A computer-implemented method for producing a multilayer circuit board layout, the computer-implemented method comprising:
  producing, using a circuit board design tool, a circuit board layout for a multilayer circuit board being fabricated, the producing comprising:
    identifying, by the circuit board design tool, a layer of the multilayer circuit board with an internal clearance region about an aperture of the multilayer circuit board having a voltage-to-ground clearance of conductive material to be modified;
    determining, by the circuit board design tool, a configuration and orientation of a connector pin to be press-fit connected within the aperture of the multilayer circuit board; and
    modifying, by the circuit board design tool, the voltage-to-ground clearance of conductive material in the internal clearance region of the layer about the aperture based on the determined configuration and orientation of the connector pin to be press-fit connected within the aperture of the multilayer circuit board, the voltage-to-ground clearance being modified in a direction of greatest normal force outward from the aperture with insertion of the connector pin into the aperture to accommodate any deformation of the circuit board in the direction of greatest normal force outward from the aperture with insertion of the connector pin into the aperture.

12. The computer-implemented method of claim 11, wherein the modifying comprises elongating the internal clearance region about the aperture in the layer, with the longer axis of the elongated clearance region being oriented based, at least in part, on configuration of the connector pin to be received in the aperture to provide enhanced clearance between the conductive material in the direction of greatest normal force outward from the aperture with insertion of the connector pin into the aperture.

13. The computer-implemented method of claim 12, wherein the modifying further comprises orienting the longer axis of the elongated clearance region based on the configuration and orientation of the connector pin to be received in the aperture to provide enhanced clearance between the conductive material in the direction of greatest normal force outward from the aperture with insertion of the connector pin into the aperture.

14. The computer-implemented method of claim 11, where the identifying comprises determining that the layer of the multilayer circuit board is within a zone of connector pin-to-aperture interaction with insertion of the connector pin into the aperture.

15. The computer-implemented method of claim 11, further comprising initiating fabrication of the multilayer circuit board using the circuit board layout with the modified voltage-to-ground clearance of conductive material in the internal region of the layer about the aperture.

16. A computer system for facilitating producing a multilayer circuit board layout, the computer system comprising:
  a memory; and at least one processor in communication with the memory, wherein the computer system is configured to perform a method, the method comprising:

producing, via a circuit board design tool, a circuit board layout for a multilayer circuit board being fabricated, the producing comprising:

identifying, by the circuit board design tool, a layer of the multilayer circuit board with an internal clearance region about an aperture of the multilayer circuit board having a voltage-to-ground clearance of conductive material to be modified;

determining, by the circuit board design tool, a configuration and orientation of a connector pin to be press-fit connected within the aperture of the multilayer circuit board; and modifying, by the circuit board design tool, the voltage-to-ground clearance of conductive material in the internal clearance region of the layer about the aperture based on the determined configuration and orientation of the connector pin to be press-fit connected within the aperture of the multilayer circuit board, the voltage-to-ground clearance being modified in a direction of greatest normal force outward from the aperture with insertion of the connector pin into the aperture to accommodate any deformation of the circuit board in the direction of greatest normal force outward from the aperture with insertion of the connector pin into the aperture.

17. The computer system of claim 16, wherein the modifying comprises elongating the internal clearance region about the aperture in the layer, with the longer axis of the elongated clearance region being oriented based, at least in part, on configuration of the connector pin to be received in the aperture to provide enhanced clearance between the conductive material in the direction of greatest normal force outward from the aperture with insertion of the connector pin into the aperture.

18. The computer system of claim 17, wherein the modifying further comprises orienting the longer axis of the elongated clearance region based on the configuration and orientation of the connector pin to be received in the aperture to provide enhanced clearance between the conductive material in the direction of greatest normal force outward from the aperture with insertion of the connector pin into the aperture.

19. The computer system of claim 16, where the identifying comprises determining that the layer of the multilayer circuit board is within a zone of connector pin-to-aperture interaction with insertion of the connector pin into the aperture.

20. The computer system of claim 16, further comprising initiating fabrication of the multilayer circuit board using the circuit board layout with the modified voltage-to-ground clearance of conductive material in the internal region of the layer about the aperture.

21. A computer program product for facilitating producing a multilayer circuit board layout, the computer program product comprising:

one or more computer-readable storage media and program instructions embodied therewith, the program instructions being readable by a processing circuit to cause the processing circuit to perform a method comprising:

producing, via a circuit board design tool, a circuit board layout for a multilayer circuit board being fabricated, the producing comprising:

identifying, by the circuit board design tool, a layer of the multilayer circuit board with an internal clearance region about an aperture of the multilayer circuit board having a voltage-to-ground clearance of conductive material to be modified;

determining, by the circuit board design tool, a configuration and orientation of a connector pin to be press-fit connected within the aperture of the multilayer circuit board; and modifying, by the circuit board design tool, the voltage-to-ground clearance of conductive material in the internal clearance region of the layer about the aperture based on the determined configuration and orientation of the connector pin to be press-fit connected within the aperture of the multilayer circuit board, the voltage-to-ground clearance being modified in a direction of greatest normal force outward from the aperture with insertion of the connector pin into the aperture to accommodate any deformation of the circuit board in the direction of greatest normal force outward from the aperture with insertion of the connector pin into the aperture.

22. The computer program product of claim 21, wherein the modifying comprises elongating the internal clearance region about the aperture in the layer, with the longer axis of the elongated clearance region being oriented based, at least in part, on configuration of the connector pin to be received in the aperture to provide enhanced clearance between the conductive material in the direction of greatest normal force outward from the aperture with insertion of the connector pin into the aperture.

23. The computer program product of claim 22, wherein the modifying further comprises orienting the longer axis of the elongated clearance region based on the configuration and orientation of the connector pin to be received in the aperture to provide enhanced clearance between the conductive material in the direction of greatest normal force outward from the aperture with insertion of the connector pin into the aperture.

24. The computer program product of claim 21, where the identifying comprises determining that the layer of the multilayer circuit board is within a zone of connector pin-to-aperture interaction with insertion of the connector pin into the aperture.

25. The computer program product of claim 21, further comprising initiating fabrication of the multilayer circuit board using the circuit board layout with the modified voltage-to-ground clearance of conductive material in the internal region of the layer about the aperture.

* * * * *